(12) United States Patent
Yamazaki et al.

(10) Patent No.: US 7,902,002 B2
(45) Date of Patent: Mar. 8, 2011

(54) SEMICONDUCTOR DEVICE

(75) Inventors: Shunpei Yamazaki, Tokyo (JP);
Koichiro Tanaka, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 678 days.

(21) Appl. No.: 11/631,545

(22) PCT Filed: Jul. 25, 2005

(86) PCT No.: PCT/JP2005/013985
§ 371 (c)(1),
(2), (4) Date: Jan. 4, 2007

(87) PCT Pub. No.: WO2006/027912
PCT Pub. Date: Mar. 16, 2006

(65) Prior Publication Data
US 2008/0135848 A1 Jun. 12, 2008

(30) Foreign Application Priority Data

Jul. 30, 2004 (JP) ............................. 2004-224281

(51) Int. Cl.
*H01L 21/00* (2006.01)
*H01L 21/84* (2006.01)
(52) U.S. Cl. ... 438/150; 438/164; 438/166; 257/E21.134; 257/E21.413; 257/E21.414; 257/E27.111; 257/E29.137; 257/E29.151; 257/E29.278; 257/E29.293; 257/E29.295
(58) Field of Classification Search .................. 438/150, 438/164, 166; 257/E21.134, E21.413, E21.414, 257/E27.111, E29.137, E29.151, E29.278, 257/E29.293, E29.295
See application file for complete search history.

(56) References Cited

U.S. PATENT DOCUMENTS

| 6,451,636 | B1 | 9/2002 | Segawa et al. | |
|---|---|---|---|---|
| 6,549,547 | B2 | 4/2003 | Galvanauskas et al. | |
| 6,574,250 | B2 | 6/2003 | Sun et al. | |
| 6,760,356 | B2 | 7/2004 | Erbert et al. | |
| 6,979,605 | B2 | 12/2005 | Yamazaki et al. | |
| 7,078,322 | B2 | 7/2006 | Tanada et al. | |
| 2003/0183875 | A1 | 10/2003 | Isobe et al. | |
| 2004/0072411 | A1* | 4/2004 | Azami et al. ................. | 438/482 |
| 2005/0139786 | A1* | 6/2005 | Tanaka et al. ............... | 250/492.2 |
| 2005/0237895 | A1* | 10/2005 | Tanaka et al. ................. | 369/97 |
| 2005/0255716 | A1 | 11/2005 | Tanaka et al. | |

FOREIGN PATENT DOCUMENTS

| JP | 11-111986 | 4/1999 |
|---|---|---|
| JP | 3276900 | 4/2002 |

OTHER PUBLICATIONS

International Search Report for PCT/JP2005/013985 dated Nov. 8, 2005.
Written Opinion of the International Searching Authority for PCT/JP2005/013985 dated Nov. 8, 2005.

\* cited by examiner

*Primary Examiner* — Long K Tran
(74) *Attorney, Agent, or Firm* — Nixon Peabody LLP; Jeffrey L. Costellia

(57) ABSTRACT

When a semi-conductor film is irradiated with conventional pulsed laser light, unevenness, which is called as ridge, is caused on the surface of the semiconductor film. In the case of a top-gate type TFT, element characteristics are changed depending on the ridge. In particular, there is a problem in that variation in the plural thin film transistors electrically connected in parallel with one another. According to the present invention, in manufacturing a circuit including plural thin film transistors, the width LP of a region (not including a microcrystal region) that is melted by irradiating a semiconductor film with light of a continuous wave laser is enlarged, and active layers of a plurality of thin film transistors (that are electrically connected in parallel with one another) are arranged in one region.

15 Claims, 12 Drawing Sheets

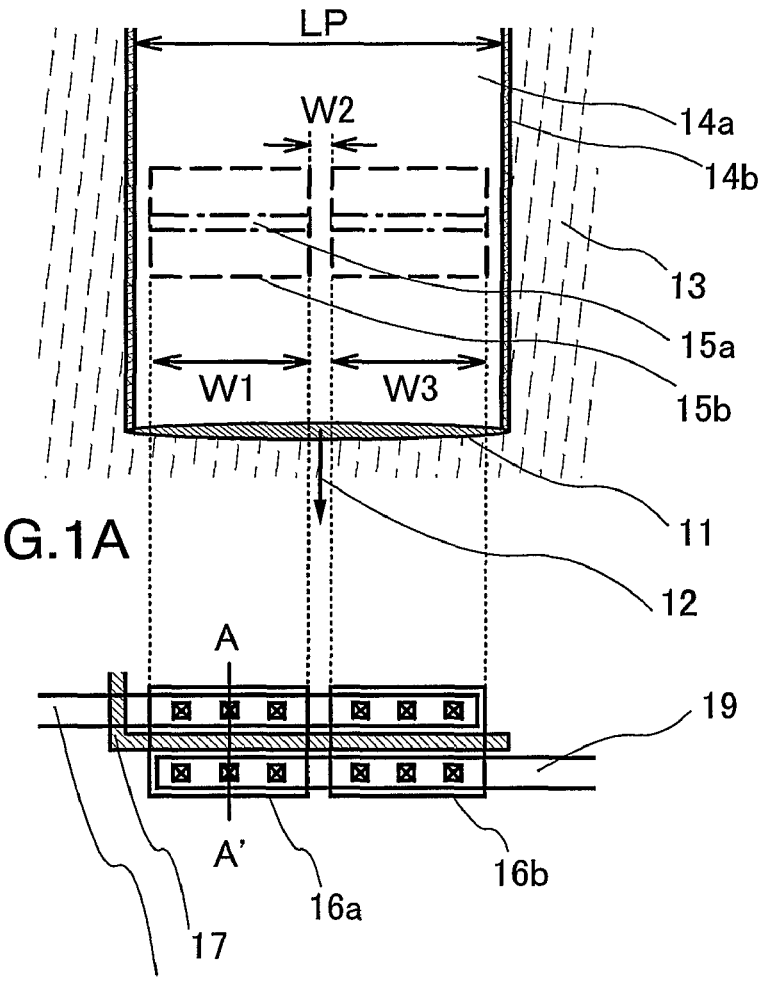
FIG.1A
FIG.1B
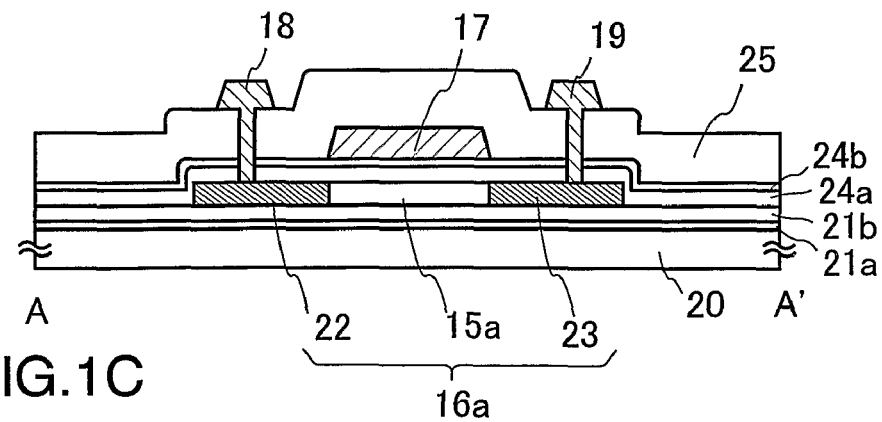
FIG.1C

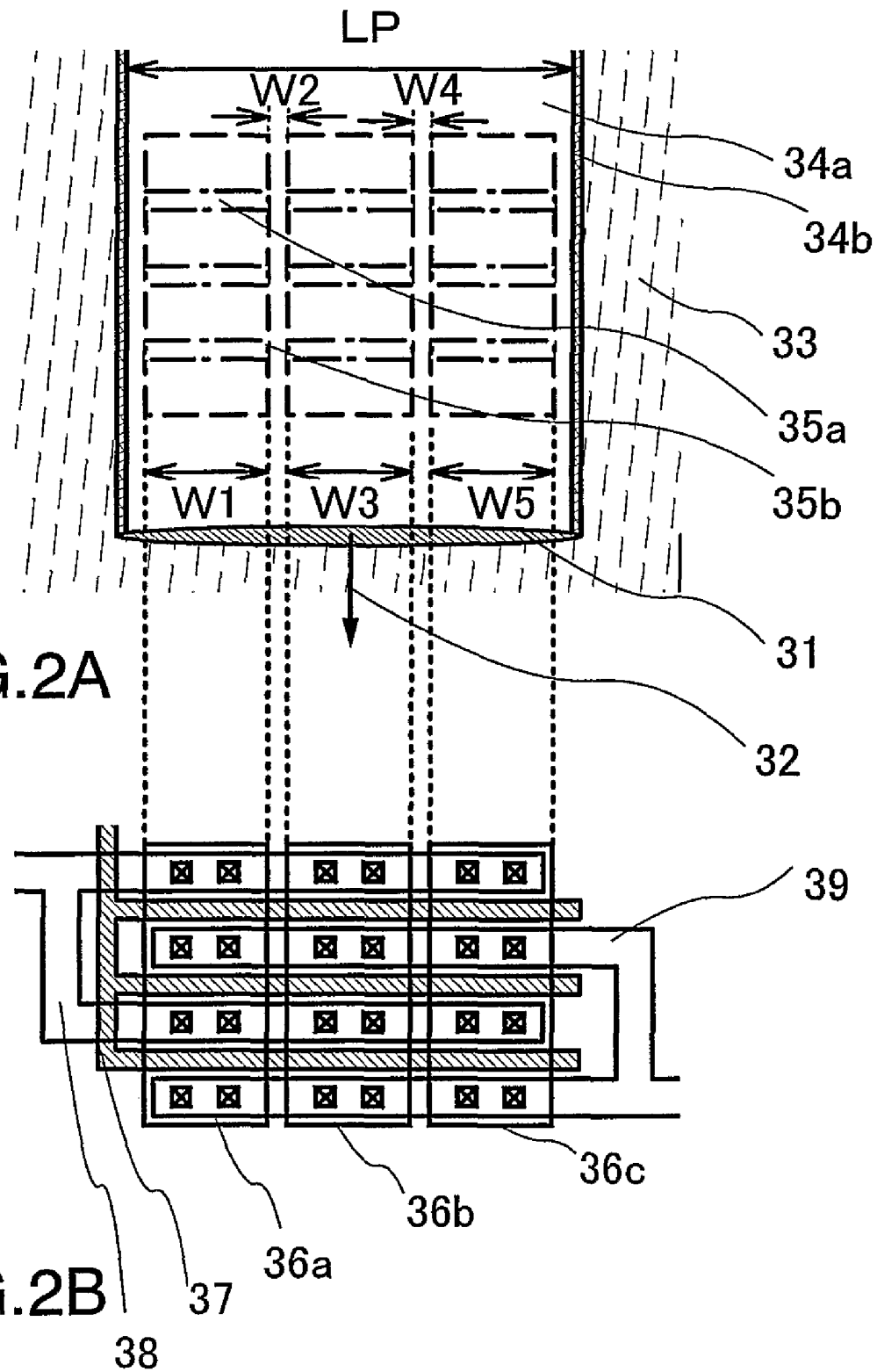

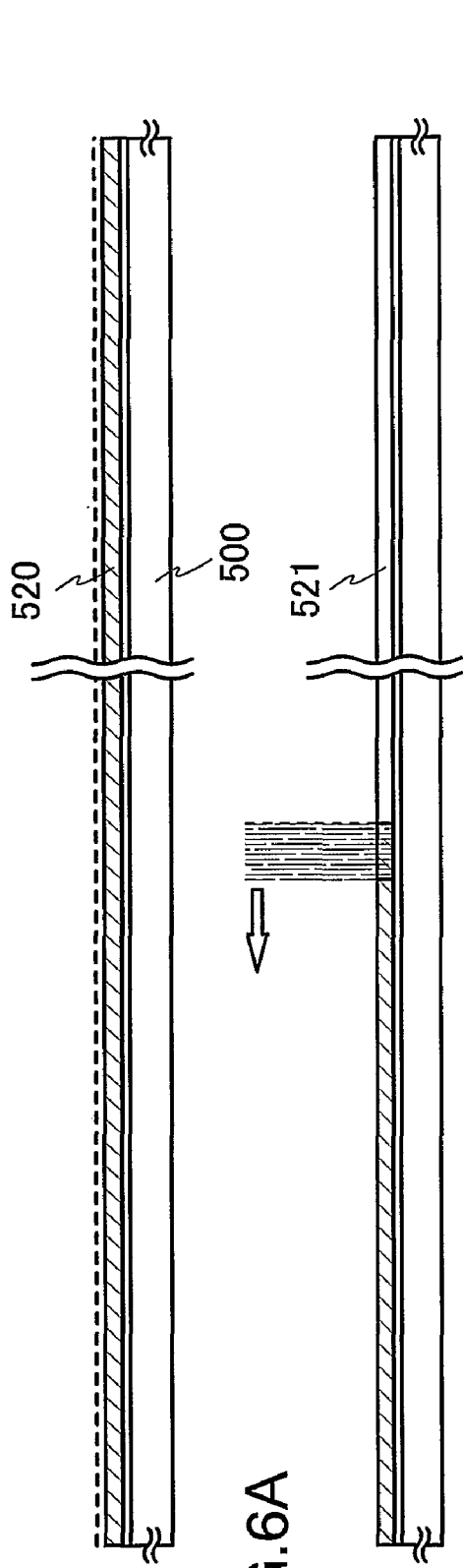

SEMICONDUCTOR DEVICE

TECHNICAL FIELD

The present invention relates to a semiconductor device having a circuit including a thin film transistor (hereinafter, TFT) and a manufacturing method thereof. For example, the present invention relates to an electronic device having, as a component part thereof, an electro-optic device typified by a liquid crystal display panel or a light-emitting display device with an organic light-emitting element.

Note that a semiconductor device in this specification means a generic device which can operate with use of semi-conductive characteristics and includes all types of devices such as an electro-optic device, a semiconductor circuit and an electronic device.

BACKGROUND ART

In recent years, a technology for forming a thin film transistor (TFT) using a semiconductor thin film (a thickness of around several nanometers to several hundred nanometers) formed over a substrate having an insulating surface has been attracting attention. Thin film transistors are broadly applied to electronic devices such as an IC or an electro-optic device, and are particularly developed as switching elements for image display devices at a rapid rate.

Above all, a thin film transistor (TFT) formed using a polycrystalline semiconductor film is higher in mobility by two digits or more than a TFT formed using an amorphous semiconductor film, and has an advantage that a pixel portion and a peripheral driver circuit in a semiconductor display device can be formed to be integrated over the same substrate. The polycrystalline semiconductor film can be formed over an inexpensive glass substrate by employing a laser annealing method.

As laser oscillators used in the laser annealing method, there are two types, a pulsed laser oscillator and a continuous wave laser oscillator, according to the oscillation method. The pulsed laser typified by an excimer laser has output power per unit time which is approximately three to six digits higher than that of the continuous wave laser. Therefore, the through-put of the laser irradiation can be increased by shaping a beam spot (a region irradiated with the laser beam in fact on the surface of an object to be irradiated) into a rectangular spot having a length of several cm on a side or a linear spot having a length of 100 mm or more with the use of an optical system to efficiently conduct laser irradiation to a semiconductor film. For this reason, the pulsed laser has been mainly employed for crystallizing the semiconductor film.

It is noted that a term of "linear" herein used does not mean a line in a strict sense but means a rectangle (or elongated ellipse) having a large aspect ratio. For example, a rectangular beam spot having an aspect ratio of 2 or more (preferably 10 to 10000) is referred to as a linear beam spot. It is to be noted that the linear is included in the rectangular.

Reference 1 (Japanese Patent No. 3276900) describes a technology by which, as to two channel-forming regions (CH) each having a channel width W to become an operation design value, the total value of W and an interval distance WA between the two channel-forming regions is made larger than a pitch P of a pulsed laser, using the pulsed laser.

DISCLOSURE OF THE INVENTION

An excimer laser is widely used as a pulsed laser. However, the excimer laser has a difficulty in extremely enlarging the cross-sectional area of a laser beam in relation to its output power. Therefore, laser beams (hereinafter, also referred to as laser light) are transformed into a band-like or a linear shape, and overlapped with one another to be scanned so as to irradiate the whole surface of a substrate therewith. The grain size of a crystal becomes uneven due to an influence of energy distribution of the laser beam at the scanning time.

The semiconductor film crystallized thus by the pulsed laser beam includes plenty of crystal grains whose positions and sizes are random. Unlike the inside of the crystal grain, an interface between the crystal grains (a crystal grain boundary) includes an infinite number of trapping centers or recombination centers due to crystal defects or an amorphous structure. When the carrier is trapped in the trapping center, the potential of the crystal grain boundary increases and becomes a barrier against the carrier; thereby causing a problem in that the transporting property of the carrier decreases.

In the case where pulsed laser light is emitted onto a semiconductor film, as soon as the semiconductor film is irradiated by the pulsed laser light, the surface thereof is melted. After that, the semiconductor film melted due to heat conduction to the substrate is cooled to coagulate from the substrate side. Although the semiconductor film is recrystallized in this coagulation process to become a semiconductor film having a crystal structure with a large grain size, unevenness, which is called as ridge, is caused on the surface of the semiconductor film because the semiconductor film has been melted once and the volume thereof has become large. In particular, in the case of a top-gate type TFT, a surface with ridges becomes a interface to be in contact with a gate insulating film; therefore, element characteristics are changed because of the ridges.

By the above described reasons, there is a problem in that variation in operation characteristics of a driving thin film transistor which is integrated in a display device or the like is caused to generate display unevenness (mura). Specifically, variation between a plurality of thin film transistors electrically connected in parallel with each other is a problem. In addition, also in the case of forming a CPU or the like in which a circuit having a thin film transistor is integrated, there is a problem in that variation in operation characteristics of the thin film transistors is caused and a uniform operation is difficult to conduct.

A technique relating to the crystallization of the semiconductor film with the use of the continuous wave laser has attracted attention recently. In the case of the continuous wave laser, unlike a conventional pulsed laser, when the laser beam is scanned in one direction to irradiate the semiconductor film, it is possible to grow a crystal continuously in the scanning direction and to form an aggregation of crystal grains including a single crystal extending long in the scanning direction. Thus, unevenness, that is, ridge, is not produced. By the above described method, a semiconductor film, in which almost no crystal boundaries intersecting at least with the channel direction of a TFT exist, can be formed.

One aspect of the present invention is that, in manufacturing a circuit including a plurality of thin film transistors, the width LP of a region (not including a microcrystal region) that is melted by irradiating a semiconductor film with continuous wave laser light is increased, and active layers of the plurality of thin film transistors (that are electrically connected in parallel with one another) are arranged in one region.

As a circuit including a plurality of thin film transistors, typically, a CMOS circuit, an NMOS circuit, a PMOS circuit and the like are given. An inverter circuit, a NAND circuit, an AND circuit, a NOR circuit, an OR circuit, a shift register circuit, a sampling circuit, a D/A converter circuit, an A/D converter circuit, a latch circuit, a buffer circuit or the like can be manufactured using a CMOS circuit, an NMOS circuit or a PMOS circuit. In addition, a memory element such as an SRAM or a DRAM, or other elements can be constituted by combining these circuits.

When a semiconductor film is irradiated with continuous wave laser light, a microcrystal region with a small grain size is formed between an irradiated region and a non-irradiated region. The microcrystal regions are formed on the opposite sides to sandwich a crystal region with a relatively large crystal. In addition, when the whole surface of the semiconductor film is irradiated with laser light, it is preferable to scan laser light so as to overlap these microcrystal regions with one another.

The pitch in this specification means a width of the irradiated region including one microcrystal region on one side. Further, the laser beam width LP means a width of the irradiated region that does not include the microcrystal region, in other words, the distance between microcrystal regions next to each other (the width of the crystal region with a relatively large crystal). Moreover, the total width of the laser beam means a width of the irradiated region including the both microcrystal regions on the opposite sides, in other words, the total width of a shape of the laser beam on the irradiated surface.

A structure of the present invention disclosed in this specification is a semiconductor device in which a thin semiconductor film is formed over a substrate having an insulating surface, and irradiated with a continuous wave laser beam to melt and cool the thin semiconductor film to be recrystallized, and which includes a plurality of thin film transistors each using the thin semiconductor film as an active layer; wherein the plurality of thin film transistors are electrically connected in parallel, and wherein a sum of WC and WS, in which the WC is a sum of widths of channel forming regions in the plurality of thin film transistors and the WS is an interval of the channel forming regions, is smaller than a width LP of the continuous wave laser beam.

In the case where, at least two thin film transistors are arranged in parallel, another structure of the present invention is a semiconductor device in which a thin semiconductor film is formed over a substrate having an insulating surface, and irradiated with a continuous wave laser beam to melt and cool the thin semiconductor film to be recrystallized, and which includes a plurality of thin film transistors each using the thin semiconductor film as an active layer, wherein at least two thin film transistors of the plurality of thin film transistors are electrically connected in parallel, and wherein a sum of W1+W2+W3, that is, the sum of a width W1 of a channel forming region in a first thin film transistor, an interval W2 between the channel forming region in the first thin film transistor and a channel forming region in a second thin film transistor formed at a position adjacent to the channel of the first thin film transistor and a width W3 of the channel forming region in the second thin film transistor, is smaller than a width LP of the continuous wave laser beam.

In the present invention, the pulsed laser having a repetition rate of 10 MHz or more (which is also called a quasi-CW laser) can be used instead of a continuous wave (CW) laser. This repetition rate is extremely higher than that of the conventional pulsed laser, which is from several tens to several hundred Hz. It is said that it takes several tens to several hundred ns to solidify the semiconductor film completely after the semiconductor film is irradiated with the pulsed laser light. When the pulsed laser light has a repetition rate of 10 MHz or more, it is possible to irradiate the semiconductor film with pulsed laser light before the semiconductor film is solidified after it has been melted by the previous laser light.

Therefore, unlike the case of using the conventional pulsed laser, the interface between the solid phase and the liquid phase can be moved continuously in the semiconductor film, and the semiconductor film having a crystal grain grown continuously in the scanning direction is formed. Specifically, it is possible to form an aggregation of crystal grains each of which has a width from 10 to 30 µm, preferably 10 to 60 µm, in the scanning direction and a width from approximately 1 to 5 µm in a direction perpendicular to the scanning direction.

The quasi-CW laser can drastically enlarge an area of a beam spot, suppress thermal damages to a glass substrate, make a crystal continuously grow in a scanning direction, and form an aggregation of single crystals extending long in the scanning direction, as compare with a continuous wave laser.

Another structure of the present invention is a semiconductor device in which a thin semiconductor film is formed over a substrate having an insulating surface, and irradiated with a pulsed laser beam having a repetition rate of 10 MHz or higher and 100 GHz or lower to melt and cool the thin semiconductor film to be recrystallized, and which includes a plurality of thin film transistors each using the thin semiconductor film as an active layer, wherein the plurality of thin film transistors are electrically connected in parallel, and wherein a sum of WC and WS, in which the WC is a sum of widths of channel forming regions in the plurality of thin film transistors and the WS is an interval of the channel forming regions, is smaller than a width LP of the pulsed laser beam.

Another structure of the present invention is a semiconductor device in which a thin semiconductor film is formed over a substrate having an insulating surface, and irradiated with a pulsed laser beam having a repetition rate of 10 MHz or higher and 100 GHz or lower to melt and cool the thin semiconductor film to be recrystallized, and which includes a plurality of thin film transistors each using the thin semiconductor film as an active layer, wherein at least two thin film transistors of the plurality of thin film transistors are electrically connected in parallel, and wherein a sum of W1+W2+W3, that is, the sum of a width W1 of a channel forming region in a first thin film transistor, an interval W2 between the channel forming region in the first thin film transistor and a channel forming region in a second thin film transistor formed at a position adjacent to the channel of the first thin film transistor and a width W3 of the channel forming region in the second thin film transistor, is smaller than a width LP of the pulsed laser beam.

One feature of the present invention is that, in the above described structure, the plurality of thin film transistors are arranged at even intervals.

The CW laser used in the present invention is not limited in particular, and a YAG laser, a $YVO_4$ laser, a $GdVO_4$ laser, a YLF laser, or an Ar laser can be used.

Any laser may be used as the quasi-CW laser, as long as it can emit an extremely short pulsed laser beam having a pulse width of 20 ps or less. For example, an excimer laser, an Ar laser, a Kr laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:Sapphire laser, a copper vapor laser or a gold vapor laser or the like can be used.

When the method for manufacturing a crystalline semiconductor film of the present invention is applied to manufacture a crystalline semiconductor film, it is possible to obtain a crystalline semiconductor film having superior characteristic at high throughput. Moreover, when semiconductor elements are manufactured using the crystalline semiconductor film that is crystallized by the method for manufacturing a crystalline semiconductor film of the present invention, the variation of the characteristic can be reduced between the semiconductor elements.

BRIEF DESCRIPTION OF DRAWINGS

In the accompanying drawings:

FIGS. 1A to 1C are top views and a cross-sectional view according to one aspect of the present invention (Embodiment Mode 1);

FIGS. 2A and 2B are each a top view according to one aspect of the present invention (Embodiment Mode 2);

FIGS. 6A to 6D show a laser irradiation method and a manufacturing method of a semiconductor device;

BEST MODE FOR CARRYING OUT THE INVENTION

Figure 3:
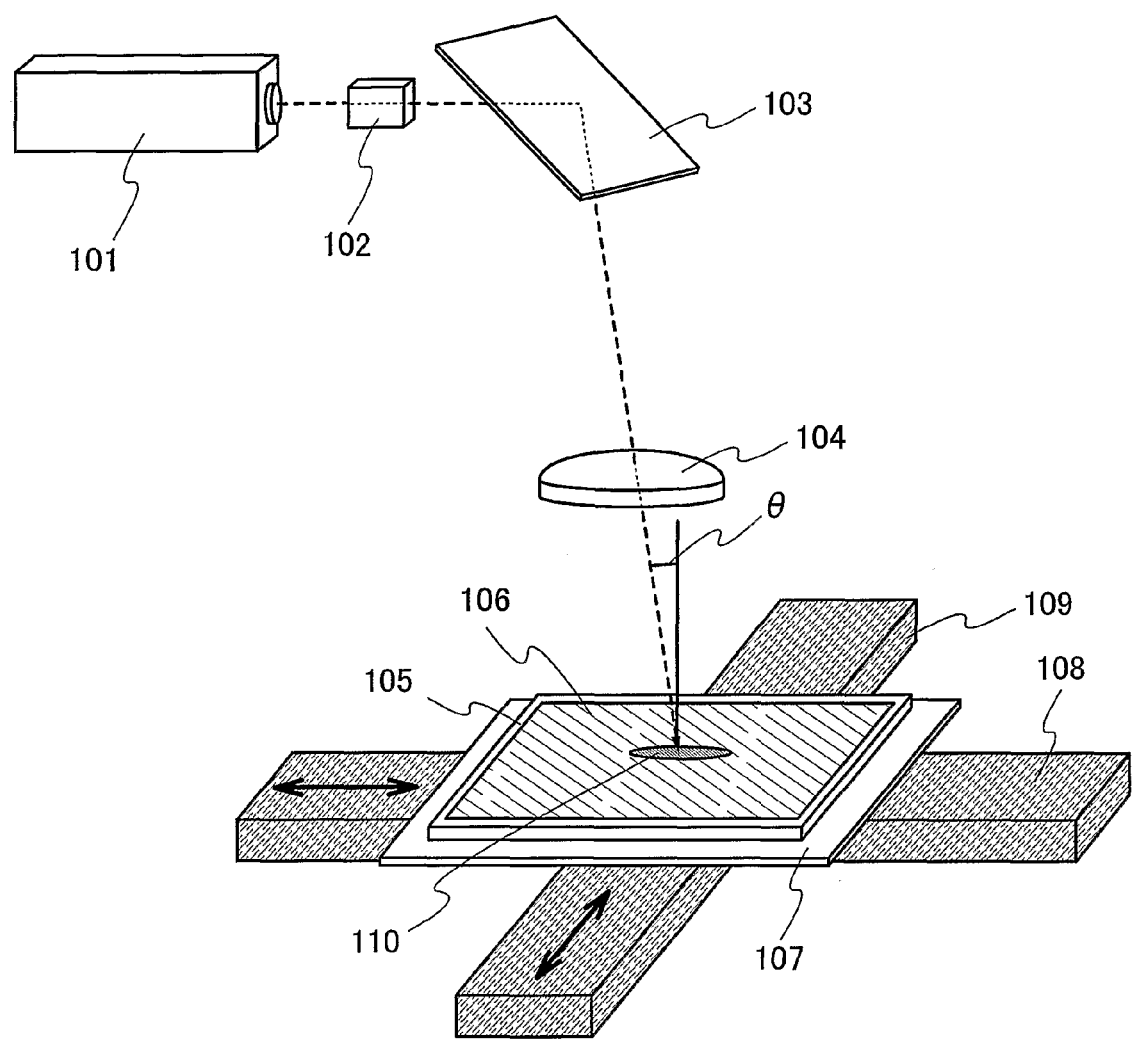
FIG. 3 shows a laser irradiation apparatus.

Embodiment Modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below.

Embodiment Mode 1

A state in which a CW laser beam is scanned on the surface of a semiconductor film formed over a substrate and a manufactured TFT are described with reference to FIGS. 1A to 1C.

FIG. 1A is a top view showing a scanning state of a laser beam 11 on a surface of an amorphous semiconductor film. The laser beam 11 has an elongated elliptical spot and is scanned in a scanning direction 12 shown by the arrow in the drawing to partially form a crystal region.

Although not shown in FIG. 1A, a base insulating film is formed over the substrate having an insulating surface and an amorphous semiconductor film is formed thereover, since an example of forming a top gate type TFT is shown in the drawing.

In crystallizing the amorphous semiconductor film, a continuous wave solid-state laser is used and a laser beam with a second, third or fourth harmonic of a fundamental wave is emitted onto the semiconductor film to obtain a crystal with a large grain size in this embodiment mode. Typically, for instance, the second harmonic (532 nm) or the third harmonic (355 nm) of an Nd:YVO$_4$ laser (fundamental wave with 1064 nm) is preferably used. Concretely, a laser beam emitted from a continuous wave YVO$_4$ laser is converted into a harmonic by a nonlinear optical element to obtain a laser beam with an output power of 10 W. As an example of a resonator, a YVO$_4$ crystal and a non-linear optical element are included in a resonator to emit a harmonics. Then, the laser beam is preferably shaped into a rectangular or elliptical spot on an irradiated surface by the optical system, so that an object is irradiated with the laser beam. In this case, the power density of about 0.01 to 100 MW/cm$^2$ (preferably, 0.1 to 10 MW/cm$^2$) is required.

As the method for scanning the laser light, there are following methods: a moving method of an irradiation system by which an irradiated position of the laser light is moved with a substrate as a processing object fixed; a moving method of an object by which a substrate is moved with an irradiated position of the laser light fixed; and a method in which these two methods are combined. In any case, it is necessary to control the moving direction of each laser beam spot relative to the semiconductor film. In this embodiment mode, the amorphous semiconductor film is moved relatively to the laser light at a speed of about 10 to 2000 cm/sec to be irradiated with the laser light. When the substrate has the swell, the laser irradiation is preferably performed by operating an auto-focusing mechanism according to the swell.

A region 14a where the crystal grain grown in the scanning direction by laser irradiation is formed has very superior crystallinity. Therefore, when this region is used for the channel-forming region of the TFT, considerably high mobility or ON current can be expected.

As shown in FIG. 1A, it is preferable to design in such a way that a region 15a to become a channel of a TFT to be formed later is located inside the irradiated region 14a. In particular, as shown in the top view of FIG. 1B, when two TFTs are arranged in parallel to be electrically connected with each other, the regions to become channels of the both TFTs are located inside the irradiated region 14a. In FIG. 1B, the two TFTs are arranged in a direction perpendicular to the scanning direction. In other words, one feature of the present invention is that the width LP of the irradiated region 14a is larger than the sum of a channel width W1 of a first TFT, a channel width W3 of a second TFT, and an interval W2 between the channels (W1+W2+W3).

In a region between the irradiated region 14a and the non-irradiated region 13, an irradiated region to become a microcrystal 14b is formed. The irradiated region 14b is formed not to overlap a region to become an active layer 15b, because it is not preferable that the irradiated region to become a microcrystal 14b is used as a part of an active layer of the TFT. In addition, scanning is conducted to overlap the regions to become a microcrystal 14b with one another in the case of a repetitive irradiation. In other words, parts of the regions to become a microcrystal 14b are overlapped.

After the laser irradiation, patterning is conducted to form two island-shaped semiconductor layers, and a gate insulating film, a gate electrode, an interlayer insulating film, a source wiring, a drain wiring and the like are formed by a known method to complete a thin film transistor.

FIG. 1B shows a connection mode of the two completed TFTs. FIG. 1B is shown to correspond to FIG. 1A; however, in fact, the size of the active layer is reduced due to shrinkage of the substrate or the like by a heat treatment or the like in the manufacturing process of the TFTs.

In FIG. 1B, a first semiconductor layer 16a and a second semiconductor layer 16b are arranged in parallel. In addition, a gate wiring 17, a source wiring 18 and a drain wiring 19 are common in the two TFTs, and the two TFTs are electrically connected in parallel with each other.

The cross sectional view taken along the solid line A-A' in FIG. 1B is shown in FIG. 1C. A typical manufacturing process of a TFT according to the present invention is briefly shown hereinafter.

In FIG. 1C, a substrate 20 can be a glass substrate, a quartz substrate or the like. In addition, a plastic substrate having heat-resistance enough to resist a processing temperature in this process may be used.

As shown in FIG. 1C, a base insulating film formed of an insulating film such as a silicon oxide film, a silicon nitride film or a silicon oxynitride film ($SiO_xN_y$) is formed over the substrate 20. As a typical example of the base insulating film, a two-layer structure in which a silicon nitride oxide film 21a of 50 to 100 nm thick that is formed using $SiH_4$, $NH_3$ and $N_2O$ as a reactive gas and a silicon oxynitride film 21b of 100 to 150 nm thick that is formed using $SiH_4$ and $N_2O$ as a reactive gas are continuously stacked, can be employed. In addition, a silicon nitride film (SiN film) or a silicon oxynitride film ($SiN_xO_y$ film, x>y) that is 10 nm or less thick is preferably used as one layer of the base insulating film. Alternatively, a three-layer structure in which a silicon nitride oxide film, a silicon oxynitride film and a silicon nitride film are continuously stacked may be employed.

Thereafter, a semiconductor film having an amorphous structure is formed over the base insulating film. A semiconductor material mainly containing silicon is used as the semiconductor film. Typically, an amorphous silicon film or an amorphous silicon germanium film is formed by a known method (such as sputtering, LPCVD or plasma CVD). Then, by the above described CW laser, a semiconductor film having a crystalline structure is obtained.

Then, patterning is conducted by a photolithography method to obtain first and second semiconductor layers. Ozone is generated using an ozone-containing aqueous solution or by UV-light irradiation in an oxygen atmosphere to form an oxide film for protecting each semiconductor layer before forming a resist mask in patterning. The oxide film also has a function of enhancing the wettability of the resist.

It should be noted that doping a slight amount of an impurity element (boron or phosphorus) is conducted to control a threshold value of a TFT through the oxide film before patterning if necessary. When the doping is conducted through the oxide film, the oxide film is removed and then an oxide film is formed again using an ozone-containing solution.

Thereafter, an insulating film mainly containing silicon to become a gate insulating film is formed to cover each semiconductor layer. A silicon oxide film or a silicon oxynitride film is formed as the gate insulating film by PCVD to have a relatively thin thickness of 10 to 100 nm, preferably 10 to 30 nm. A circuit including a TFT can drive at higher speed by thinning the gate insulating film. Here, the gate insulating film is formed to have a stacked structure of a first insulating film 24a including a silicon oxide film and a second insulating film 24b including a silicon nitride oxide film. It should be noted that the oxide film may be removed using an etchant containing hydrofluoric acid before forming the gate insulating film. In addition, the oxide film in the semiconductor layer is not necessary to be completely removed and the oxide film may be thinly left. If overetching is made to expose the semiconductor layer, there is a risk that the surface is contaminated by impurities.

Then, the surface of the gate insulating film is cleaned. After that, a metal film (a single layer or a stacked layer of an element selected from Mo, Ta, W, Ti, Al and Cu, or an alloy material or a compound material mainly containing the element) is formed by a sputtering method.

The metal film is patterned by a photolithography method to form a gate wiring 17.

An impurity element imparting n-type conductivity (such as P or As) or an impurity element imparting p-type conductivity (such as B) are appropriately doped into each semiconductor layer to form a source region 22 and a drain region 23. Such an impurity element is added to the semiconductor layer through the gate insulating film by an ion-doping method or an ion-implantation method. If an n-channel TFT is to be formed, an impurity element imparting n-type conductivity may be added to form an impurity region. If a p-channel TFT is to be formed, an impurity element imparting p-type conductivity may be added to form an impurity region.

In the following steps, an interlayer insulating film 25 is formed, hydrogenation is conducted to form contact holes that reach the source region 22 and the drain region 23, a conductive film is formed and patterned to form a source electrode 18 and a drain electrode 19, thereby completing a TFT.

The present invention is not limited to the structure of the TFT shown in FIG. 1C. An LDD (Lightly Doped Drain) structure having an LDD region between a channel-forming region and a drain region (or a source region) may be employed if necessary. In this structure, a region into which an impurity element is added at a low concentration is provided between the channel-forming region and the source or drain region formed by being doped with a high concentration of an impurity element, and the region is called an LDD region. Moreover, a GOLD (Gate-drain Overlapped LDD) structure may also be employed, in which an LDD region overlaps a gate electrode with a gate insulating film therebetween.

A top gate type TFT is described here as one example; however, the present invention can be applied regardless of a TFT structure, and the present invention can be applied to e.g., a staggered type TFT.

According to the present invention, a CW laser is used instead of a conventional pulsed laser, and thus, the semiconductor layer 16a having a flat surface without ridges can be obtained. In addition, the gate insulating films 24a and 24b can be more thinned.

Embodiment Mode 2

A state in which a quasi-CW laser beam is scanned on a surface of a semiconductor film formed over a substrate and a manufactured TFT are described with reference to FIGS. 2A and 2B.

FIG. 2A is a top view showing a scanning state of a laser beam 31 on a surface of an amorphous semiconductor film. The laser beam 31 has an elongated elliptical spot and is scanned in a scanning direction 32 shown by the arrow in the drawing to partially form a crystal region.

Although not shown in FIG. 2A, a base insulating film is formed on the substrate having an insulating surface and an amorphous semiconductor film is formed thereover, since an example of forming a top gate type TFT is shown in the drawing.

In crystallizing the amorphous semiconductor film, a $YVO_4$ laser having an output power of 1.8 W is used and the repetition rate is 80 MHz and the pulse width is about 12 ps. The pulse repetition rate is not limited to 80 MHz in the present invention, and it may be 10 MHz or more. Moreover, in the present invention, the upper limit of the repetition rate may be 100 GHz so as to obtain the laser light having high circularity and having the same wavefront to such a degree that the focusing property is not interrupted. In addition, the present invention is not limited to a solid-state laser that can obtain an output power of about 1.8 W, and for example, a large laser that can obtain an output power of as large as 300 W may be employed.

In this embodiment mode, the laser oscillator includes a stable resonator and preferably has a spatial profile of $TEM_{00}$ mode. In the case of $TEM_{00}$ mode, the laser light has Gaussian intensity distribution and is superior in the focusing property, and therefore the beam spot can be easily transformed.

The laser beam 31 is formed on an irradiated surface by an optical system to have a size of about 10 μm×100 μm. The total width of the laser beam on the irradiated surface is 100 μm. A stage is scanned in a minor axis direction of the laser beam 31. Note that the scanning speed of the beam spot is preferably several ten to several thousand mm/sec, here 400 mm/sec is adopted. By scanning the stage, the laser beam 31 is scanned relatively to the surface of the semiconductor film in the scanning direction 32 as shown in FIG. 2A. The semiconductor film is melted in the irradiated region 34a that has been irradiated with a spot of the laser beam, and the interface between the solid phase and the liquid phase moves continuously in the scanning direction. Thus, a plurality of crystal grains of single crystals grown in the scanning direction each having a width of several μm and a length from approximately 10 to 30 μm are formed to pave (fill) a region having an LP width of 70 μm.

As shown in FIG. 2A, a region 35a to become a channel of a TFT to be formed later is preferably formed inside the irradiated region 34a. In particular, in the case where three TFTs are electrically connected in parallel as shown by the top view of FIG. 2B, the regions to become channels of the three TFTs preferably exist inside the irradiated region 34a. In FIG. 2B, it is designed so that three TFTs are arranged alongside in a direction perpendicular to the scanning direction. In other words, one feature of the present invention is that the width LP of the irradiated region 34a is larger than the sum of the channel width W1 of a first TFT, a channel width W3 of a second TFT, a channel width W5 of a third TFT, and intervals W2 and W4 between the channels (W1+W2+W3+W4+W5).

Further, in FIG. 2B, it is designed so that three TFTs are arranged also in the scanning direction, and thus a total of nine TFTs are arranged. The channel-forming regions thereof are arranged at even intervals.

An irradiated region to become a microcrystal 34b is formed between the irradiated region 34a and a non-irradiated region 33. Here, microcrystal regions of 15 μm width are formed on the opposite sides of the region having an LP width of 70 μm, in which crystals are grown, in the total width 100 μm of the irradiated region (the total width of the laser beam). The irradiated region to become a microcrystal 34b is formed not to overlap a region to become an active layer 35b, because it is not preferable that the irradiated region to become a microcrystal 34b is used as a part of the active layer of the TFT.

In conducting laser irradiation onto the whole surface of the semiconductor film, the pitch of repeated scanning is 85 μm, such that the microcrystal regions of 15 μm width is overlapped with one another.

After the laser irradiation is finished, patterning is conducted to form two island-shaped semiconductor layers, and a gate insulating film, a gate electrode, an interlayer insulating film, a source wiring, a drain wiring and the like are formed by a known technology, thereby completing a TFT.

FIG. 2B shows a connection mode of the three completed TFTs. FIG. 2B is shown to correspond to FIG. 2A; however, in fact, the size of the active layer is reduced due to shrinkage of the substrate or the like by a heat treatment or the like in the manufacturing process of the TFTs.

In FIG. 2B, a first semiconductor layer 36a, a second semiconductor layer 36b and a third semiconductor layer 36c are arranged in parallel. In addition, a gate wiring 37, a source wiring 38 and a drain wiring 39 are common in the three TFTs, and the three TFTs are electrically connected in parallel.

In the case of the CW laser used in Embodiment Mode 1, the time for which a certain point in the semiconductor film is irradiated with laser light is an order of 10 μs. In this embodiment mode, however, since the pulse repetition rate is as high as 10 MHz or more, the pulse width is 1 ns or less. Therefore, the time for which the one point is irradiated with the laser light can be $10^{-4}$ times of that of the CW laser, and the peak power can be made considerably higher than that of the CW laser. For this reason, when a semiconductor film formed over a substrate is crystallized, the amount of heat given to the substrate can be suppressed drastically according to the present invention, as compared to the CW laser. Therefore, it is possible to prevent the substrate from shrinking and to prevent impurities from diffusing to the semiconductor film from another film. As a result, the characteristic of the semiconductor element can be enhanced and the yield can be increased.

A quasi-CW laser is used instead of a conventional pulsed laser and thus the semiconductor layer 36a, the second semiconductor layer 36b and the third semiconductor layer 36c having flat surfaces without ridges can be obtained. In addition, the gate insulating film can be more thinned.

Since this repetition rate extremely higher than that of a conventional pulsed laser is used, an additional advantage can be also obtained, that is, the interference caused by the light reflected from the rear surface of the substrate can be suppressed even when the laser light is emitted perpendicularly onto the substrate. Since the laser light can be delivered to the substrate perpendicularly, the optical design is made easy and the energy distribution of the obtained beam spot can be made more uniform.

This embodiment mode can be combined with Embodiment Mode 1.

The present invention having the structures described above is described in detail in Embodiments below.

EMBODIMENTS

Embodiment 1

A structure of a laser irradiation apparatus is described with reference to FIG. 3 in Embodiment 1.

Reference numeral 101 denotes a pulsed laser oscillator, which is a pulsed $YVO_4$ laser having an output power of 1.8 W in this embodiment. Reference numeral 102 denotes a non-linear optical element. The laser oscillator 101 includes a stable resonator and preferably has a spatial profile of $TEM_{00}$ mode. In the case of $TEM_{00}$ mode, the laser light has Gaussian intensity distribution and is superior in the focusing property, and therefore the beam spot can be easily transformed. Laser light emitted from the laser oscillator 101 is converted into a second harmonic (wavelength 532 nm) by the non-linear optical element 102. Although the harmonic is not particularly limited to the second harmonic, the second harmonic is preferable because it is superior in the energy efficiency to the other higher harmonics. The pulse repetition rate is set to 80 MHz and the pulse width is set to approximately 12 ps.

The pulse repetition rate is not limited to 80 MHz, and it may be 10 MHz or more. Moreover, in the present invention, the upper limit of the repetition rate may be 100 GHz so as to obtain the laser light having high circularity and having the same wavefront to such a degree that the focusing property is not interrupted.

In the laser irradiation apparatus in FIG. 3, the non-linear optical element 102 may be provided inside the resonator included in the laser oscillator 101, or a resonator equipped with a non-linear optical element may be separately provided outside a laser oscillator of a fundamental wave. The former structure has an advantage that the size of the apparatus becomes compact and that the accurate control of the resonator length is not necessary. The latter structure has an advantage that interaction of the fundamental wave and the harmonic can be ignored.

As the non-linear optical element 102, the crystal whose non-linear optical constant is relatively large such as KTP ($KTiOPO_4$), BBO ($\beta$-$BaB_2O_4$), LBO ($LiB_3O_5$), CLBO ($CsLiB_6O_{10}$), GdYCOB ($YCa_4O(BO_3)_3$), KDP ($KD_2PO_4$), KB5, $LiNbO_3$, or $Ba_2NaNb_5O_{15}$ is used. Particularly, the crystal such as LBO, BBO, KDP, KTP, KB5, CLBO, or the like can increase conversion efficiency from the fundamental wave into the harmonic.

Since laser light is generally emitted in the horizontal direction, laser light emitted from the laser oscillator 101 is reflected by a reflecting mirror 103 and its traveling direction is changed so as to have an angle (incident angle) θ from the vertical direction. In this embodiment, the angle θ is 18°. The beam spot of the laser light whose traveling direction has been changed is transformed by a lens 104 and is delivered onto a processing object set on a stage 107. In FIG. 3, a semiconductor film 106 formed over a substrate 105 is the processing object. Moreover, in FIG. 3, the reflecting mirror 103 and the lens 104 correspond to the optical system that condenses the laser light on the semiconductor film 106.

FIG. 3 shows an example in which a planoconvex spherical lens is used as the lens 104. The planoconvex spherical lens has a focal length of 20 mm. The planoconvex spherical lens is set so that the laser light enters a center of the curved surface and that the plane portion thereof is parallel to the substrate 105. The distance between the plane portion of the planoconvex spherical lens and the semiconductor film 106 is 20 mm. This forms a beam spot 110 having a size of approximately 10 μm×100 μm on the surface of the semiconductor film 106. The beam spot 110 can be extended long because of the effect of astigmatism of the lens 104.

In the case where the substrate 105 with the semiconductor film 106 formed thereover is used as the processing object as shown in FIG. 3, when the semiconductor film 106 is an amorphous semiconductor, it is preferable to perform thermal annealing to the semiconductor film 106 before the laser irradiation in order to increase the resistance of the semiconductor film 106 against the laser light. Specifically, the thermal annealing may be performed in a nitrogen atmosphere of 500° C. for approximately 1 hour. Instead of the thermal annealing, crystallization using a catalyst metal may be performed to crystallize the semiconductor film. For the semiconductor film crystallized by either method of thermal annealing or crystallization using a catalyst element, the optimum condition of the laser irradiation is almost the same.

The stage 107 can move in XY directions in a plane parallel to the substrate 105 by a robot 108 for scanning in an X-axis direction (uniaxial robot for X-axis) and a robot 109 for scanning in a Y-axis direction (uniaxial robot for Y-axis).

The stage 107 is scanned in a direction of a minor axis of the beam spot 110 using the uniaxial robot 109 for Y-axis. The scanning speed of the stage 107 is appropriate in the range of approximately several tens to several thousand mm/s, and it is set to 400 mm/s in this embodiment. The scanning of the stage 107 moves the beam spot 110 relatively to the surface of the semiconductor film 106. Therefore, a region in the semiconductor film that is irradiated with the beam spot 110 is melted, and the interface between the solid phase and the liquid phase moves continuously in the scanning direction. Thus, a plurality of crystal grains of single crystals grown in the scanning direction each having a width of several μm and a length from approximately 10 to 30 μm is formed to pave (fill) a region having an LP width of 70 μm.

Figure 4:
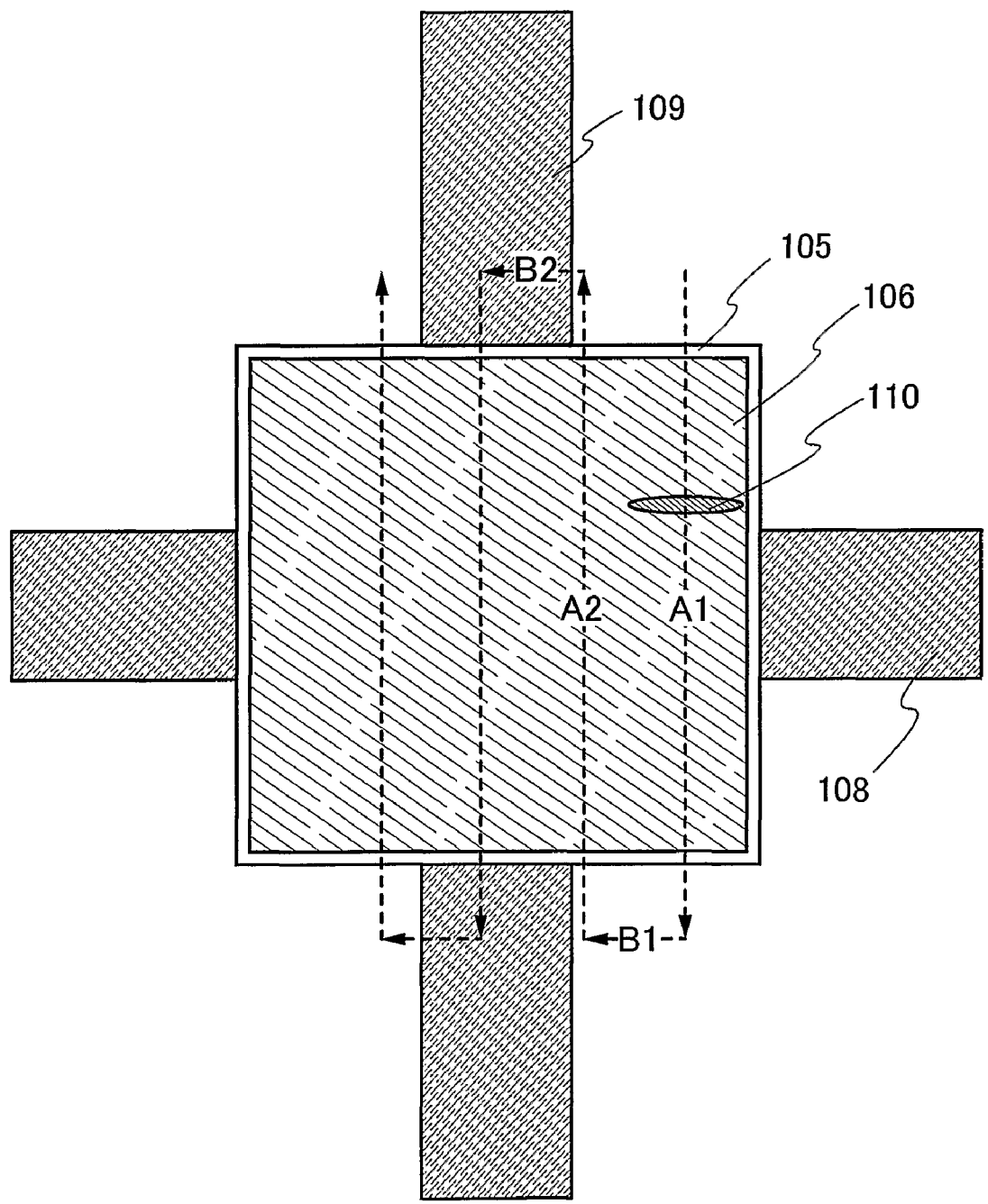
FIG. 4 shows a scanning path of a laser beam on a surface of a semiconductor film.

Next, FIG. 4 shows the scanning path of the beam spot 110 on the semiconductor film 106. In the case where the whole surface of the semiconductor film 106, which corresponds to the processing object, is irradiated with the laser light, after the beam spot 110 is scanned in one direction using the uniaxial robot 109 for Y-axis, the beam spot 110 is slid using the uniaxial robot 108 for X-axis in the direction perpendicular to the direction scanned by the uniaxial robot 109 for Y-axis. The distance for the slide corresponds to a pitch.

For example, the beam spot 110 is scanned in one direction by the uniaxial robot 109 for Y-axis. In FIG. 4, the scanning path is indicated by A1. Then, the beam spot 110 is slid in a direction perpendicular to the scanning path A1 using the uniaxial robot 108 for X-axis. The scanning path by the slide is indicated by B1. Next, the beam spot 110 is scanned in one direction opposite to the scanning path A1 with the use of the uniaxial robot 109 for Y-axis. This scanning path is indicated by A2. Then, the beam spot 110 is slid in a direction perpendicular to the scanning path A2 using the uniaxial robot 108 for X-axis. The scanning path by the slide here is indicated by B2. By repeating the scanning by the uniaxial robot 109 for Y-axis and the uniaxial robot 108 for X-axis in order, the whole surface of the semiconductor film 106 can be irradiated with the laser light.

The region where the crystal grain grown in the scanning direction is formed by the laser irradiation has very superior crystallinity. Therefore, when this region is used as the channel-forming region of the TFT, considerably high mobility and ON current can be expected. However, when there is a region in the semiconductor film that does not require such high crystallinity, such a region does not need to be irradiated with laser light. Alternatively, the laser light may be emitted under a condition that the high crystallinity is not obtained, e.g., at an increased scanning speed.

As the method for scanning the laser light, there are following methods: a moving method of an irradiation system by which an irradiated position of the laser light is moved with a substrate as a processing object fixed; a moving method of an object by which a substrate is moved with an irradiated position of the laser light fixed as shown in FIGS. 3 and 4; and a method in which these two methods are combined. In any case, it is necessary to control the moving direction of each beam spot relative to the semiconductor film.

Manufacturing steps of a TFT are described hereinafter.

A silicon oxide of 200 nm thick is formed on one surface of a glass substrate having a thickness of 0.7 mm, and then an amorphous silicon (a-Si) film of 66 nm thick is formed as a semiconductor film thereon by a plasma CVD method. After that, in order to increase the resistance of the semiconductor film against the laser, thermal annealing is performed under nitrogen atmosphere at 500° C. for one hour.

Then, the laser irradiation apparatus shown in FIG. 3 is employed to crystallize the amorphous silicon film under the condition where a YVO$_4$ laser has a second harmonic (532 nm) with a power of 1.8 W, a spatial profile of TEM$_{00}$ mode, a pulse repetition rate of 80 MHz, and a pulse width of 12 ps; the scanning speed is 400 mm/s; and the size of the beam spot is approximately 10 µm×100 µm. A state where single crystal grains, whose width is several µm and length 10 to 30 µm and which are grown in the scanning direction, to pave (fill) the region having an LP width of 70 µm.

Inside the obtained region with the LP width of 70 µm, a plurality of island-shaped semiconductor layers are patterned. For example, a first channel-forming region with a channel width W1 (W1 is 20 µm) and a second channel-forming region with a channel width W2 (W2 is 20 µm) are arranged in parallel in the region with the LP width of 70 µm, and the interval therebetween is set 10 µm. As the result thereof, the LP width of the crystal region can be made larger than the sum of the channel width and the interval (the width of the crystal region 70 µm>20 µm+20 µm+10 µm). It should be noted that the channel length L1 of the first channel-forming region and the channel length L2 of the second channel-forming region are each 8 µm.

In the following steps, at least two TFTs having the above described channel-forming regions are formed using a known technology and are electrically connected in parallel. In this way, a first TFT (L1/W1=8 µm/20 µm) and a second TFT (L2/W2=8 µm/20 µm) can be obtained. In the obtained two TFTs, crystallization is conducted uniformly in at least the two channel-forming regions and the TFTs exhibit almost the same electric characteristics.

When the two TFTs that are electrically connected in parallel are used for a part of a driver circuit to be integrated in a display device or the like, the operation characteristic can be made uniform, and display unevenness (mura) caused by a driver circuit can be eliminated.

Similarly, when e.g., a CPU, in which an NMOS circuit, a PMOS circuit or a CMOS circuit is integrated, is manufactured using the above described two TFTs, variation in operation characteristics of thin film transistors can be reduced and a uniform operation can be obtained.

This embodiment can be freely combined with Embodiment Mode 1 or 2.

Embodiment 2

Figure 5A:
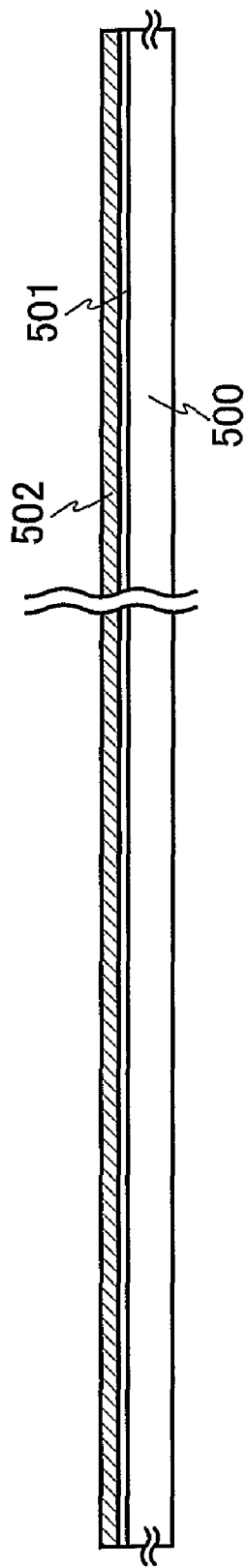
FIGS. 5A to 5C show a laser irradiation method and a manufacturing method of a semiconductor device.
Figure 5B:
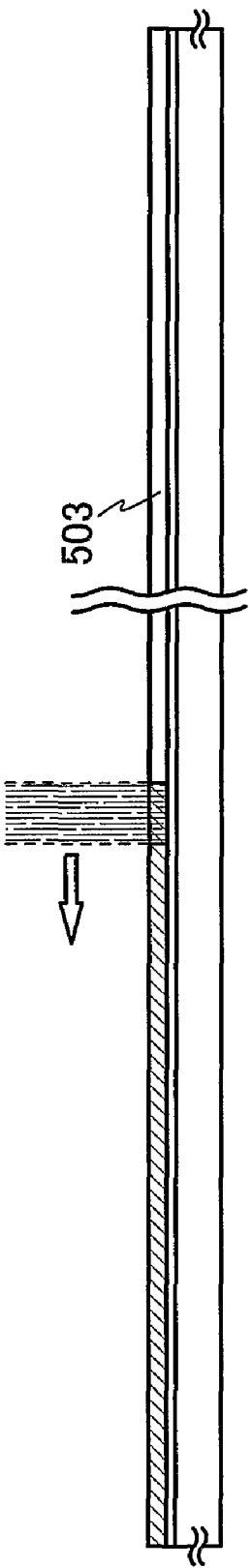
Figure 5C:
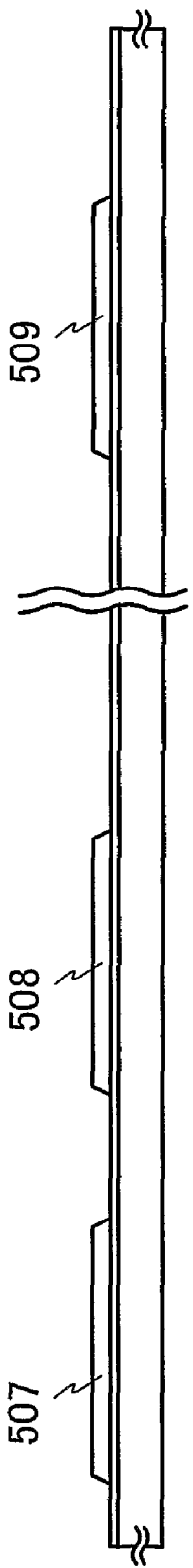

A method for manufacturing a semiconductor device is described in Embodiment 2 with reference to FIGS. 5A to 5C.

A base film 501 is formed over a substrate 500 first, as shown in FIG. 5A. For example, a glass substrate such as barium borosilicate glass or alumino borosilicate glass, a quartz substrate, a stainless substrate, or the like can be used as the substrate 500. In addition, although a substrate including a flexible synthetic resin such as acrylic or plastic typified by PET, PES or PEN tends to be inferior to the above substrates in point of resistance against heat, the substrate including a flexible synthetic resin can be used when it can resist the processing temperature in the manufacturing process.

The base film 501 is provided in order to prevent an alkaline earth metal or alkali metal such as Na included in the substrate 500 from diffusing into the semiconductor film and adversely affecting on the characteristic of the semiconductor element. Therefore, the base film is formed using an insulating material such as silicon oxide, silicon nitride, or silicon nitride oxide, which can suppress the diffusion of an alkaline earth metal and alkali metal into the semiconductor film. In this embodiment, a silicon nitride oxide film is formed to have a thickness of 10 to 400 nm (preferably, 50 to 300 nm) by a plasma CVD method.

It is noted that the base film 501 may be formed of a single insulating film or may be formed by stacking a plurality of insulating films. In the case of using the substrate including even a small amount of an alkali metal or alkaline earth metal such as a glass substrate, a stainless substrate or a plastic substrate, it is effective to provide the base film in terms of preventing the diffusion of impurities. When a substrate such as a quartz substrate into which impurities are difficult to diffuse is used, the base film is not always necessary to be provided.

Next, a semiconductor film 502 is formed over the base film 501 to have a thickness of 25 to 100 nm (preferably from 30 to 60 nm). The semiconductor film 502 may be an amorphous semiconductor or a polycrystalline semiconductor. Moreover, not only silicon but also silicon germanium can be used as the semiconductor.

Next, the laser irradiation apparatus in FIG. 3 is used to irradiate the semiconductor film 502 with laser light so as to crystallize the semiconductor film 502 as shown in FIG. 5B.

In this embodiment, the laser irradiation is performed using a YVO$_4$ laser that provides 2 W at 532 nm (second harmonic) with a repetition rate of 80 MHz, a pulse width of 12 ps, and a spatial profile of TEM$_{00}$ mode. Moreover, a beam spot formed on the surface of the semiconductor film 502 by shaping the laser light through an optical system has a rectangular shape of 10 µm in a short side and 100 µm in a long side.

Then, the beam spot is scanned on the surface of the semiconductor film 502 in a direction indicated by the outline arrow shown in FIG. 5B. By setting the pulse repetition rate to 80 MHz, the interface between the solid phase and the liquid phase can be moved continuously in the direction indicated by the outline arrow. Therefore, the crystal grain grown continuously in the scanning direction is formed. By forming a grain of the single crystal extending long in the scanning direction, it is possible to form the semiconductor film having almost no crystal grain boundaries at least in the channel direction of the TFT.

The laser irradiation may be conducted in an inert gas atmosphere such as a rare gas or nitrogen. Thus, the roughness of the semiconductor surface can be suppressed by the laser irradiation and variations in a threshold value generated by variations in the interface state density can be suppressed.

A semiconductor film 503 having more enhanced crystallinity is formed by irradiating the semiconductor film 502 with the laser light as described above.

Next, the semiconductor film 503 is patterned to form island-shaped semiconductor films 507 to 509 as shown in FIG. 5C. The island-shaped semiconductor films 507 to 509 are used to form various semiconductor elements typified by a TFT.

In the case of manufacturing a TFT, a gate insulating film is formed to cover the island-shaped semiconductor films 507 to 509, although not shown. The gate insulating film can be formed with e.g., silicon oxide, silicon nitride, silicon nitride oxide, or the like by a plasma CVD method, a sputtering method or the like.

Next, a gate electrode is formed by forming a conductive film over the gate insulating film and patterning it. Then, a source region, a drain region, and/or an LDD region, etc. are formed by adding an impurity imparting n-type or p-type conductivity to the island-shaped semiconductor films 507 to 509 using the gate electrode or a patterned resist as a mask.

By the above described steps, a TFT can be formed. The method for manufacturing a semiconductor device of the present invention is not limited to the manufacturing process of the TFT after forming the island-shaped semiconductor films as shown in this embodiment. When the semiconductor film crystallized by the laser irradiation method described above is used as an active layer of the TFT, it is possible to suppress the variation of the mobility, threshold, and ON current between the elements.

Before the laser crystallization process, a crystallization process using a catalyst element may be performed. As the catalyst element, nickel (Ni), germanium (Ge), iron (Fe), palladium (Pd), tin (Sn), lead (Pb), cobalt (Co), platinum (Pt), copper (Cu), gold (Au) or the like can be used. When the laser crystallization is performed after the crystallization using a catalyst element, the laser irradiation does not melt a lower part of the semiconductor film on a side closer to the substrate. Therefore, a crystal remains without being melted in the lower part of the semiconductor film on the side closer to the substrate and becomes a crystal nucleus, and the crystallization is promoted uniformly from the lower part on the side closer to the substrate toward the upper part of the semiconductor film. As compared to the case where the semiconductor film is crystallized only by the laser light, it is possible to enhance the crystallinity of the semiconductor film further and to suppress the roughness of the surface of the semiconductor film after the laser crystallization. Therefore, the variation of the characteristics of the semiconductor elements to be formed afterward typified by a TFT can be more suppressed and off-current can be also suppressed.

It is noted that the crystallization may be performed in such a way that a heat treatment is performed after a catalyst element is added in order to promote the crystallization and then the laser irradiation may be conducted in order to enhance the crystallinity further. Alternatively, the heat treatment may be omitted. Specifically, after adding the catalyst element, the laser light may be emitted onto the semiconductor film, instead of the heat treatment, to enhance the crystallinity.

This embodiment can be freely combined with Embodiment Mode 1 or 2, or Embodiment 1.

Embodiment 3

Unlike Embodiment 2, Embodiment 3 explains an example in which the crystallization method by the laser irradiation apparatus in FIG. 3 is combined with a crystallization method using a catalyst element.

The process up to forming the semiconductor film 502 is performed with reference to FIG. 5A in Embodiment 2. Next, as shown in FIG. 6A, a nickel acetate solution including Ni in the range of 1 to 100 ppm in weight is applied to the surface of the semiconductor film 502 by a spin coating method. It is noted that the catalyst may be added not only by the above method but also by another method such as a sputtering method, a vapor deposition method, or a plasma process. Next, a heat treatment is performed for 4 to 24 hours at temperatures ranging from 500 to 650° C., for example for 14 hours at a temperature of 570° C. This heat treatment forms a semiconductor film 520 in which the crystallization is promoted in the perpendicular direction from the surface with the nickel acetate solution applied thereon toward the substrate 500 (FIG. 6A).

The heat treatment is performed for example at a temperature of 740° C. for 180 seconds by RTA (Rapid Thermal Anneal) using radiation of the lamp as a heat source or by RTA using a heated gas (gas RTA). The set temperature is a temperature of the substrate measured by a pyrometer, and the measured temperature is herein defined as the set temperature in the heat treatment. As another method, a heat treatment using an annealing furnace at a temperature of 550° C. for 4 hours may be employed. It is an action of the metal element having the catalytic activity that lowers the temperature and shortens the time in the crystallization.

Although this embodiment uses nickel (Ni) as the catalyst element, another element such as germanium (Ge), iron (Fe), palladium (Pd), tin (Sn), lead (Pb), cobalt (Co), platinum (Pt), copper (Cu) or gold (Au) may also be used.

Subsequently, the semiconductor film 520 is crystallized using the laser irradiation apparatus in FIG. 3 as shown in FIG. 6B. In this embodiment, the second harmonic of a pulsed $YVO_4$ laser with a repetition rate of 80 MHz and a pulse width of approximately 12 ps is used as laser light.

By the laser irradiation to the semiconductor film 520 described above, a semiconductor film 521 having more enhanced crystallinity is formed. It is considered that the semiconductor film 521 crystallized using the catalyst element includes the catalyst element (herein Ni) at a concentration of approximately $1 \times 10^{19}$ atoms/cm$^3$. Next, the gettering of the catalyst element existing in the semiconductor film 521 is performed.

An oxide film 522 is formed over the surface of the semiconductor film 521 as shown in FIG. 6C. By forming the oxide film 522 with a thickness from approximately 1 to 10 nm, it is possible to prevent the surface of the semiconductor film 521 from becoming rough in the following etching process. The oxide film 522 can be formed by a known method. For example, the oxide film 522 may be formed by oxidizing the surface of the semiconductor film 521 using ozone water or using a solution in which hydrogen peroxide solution is mixed with sulfuric acid, hydrochloric acid, nitric acid or the like. Alternatively, the oxide film 522 may be formed by a plasma process, a heat treatment, ultraviolet ray irradiation, or the like in an atmosphere including oxygen. Moreover, the oxide film 522 may be formed by another method such as a plasma CVD method, a sputtering method, a vapor deposition method or the like.

A semiconductor film 523 for gettering including a rare gas element at a concentration of $1 \times 10^{20}$ atoms/cm$^3$ or more is formed to have a thickness of 25 to 250 nm over the oxide film 522 by a sputtering method. It is desirable that the mass density of the semiconductor film 523 for the gettering is lower than that of the semiconductor film 521 in order to increase the etching selectivity of the semiconductor film 523 and the semiconductor film 521 the semiconductor film 521. As the rare gas element, one or a plurality of elements selected from helium (He), neon (Ne), argon (Ar), krypton (Kr) and xenon (Xe) is used.

Next, the gettering is performed by a heat treatment according to the furnace annealing method or the RTA method. When the furnace annealing method is employed, the heat treatment is performed for 0.5 to 12 hours at temperatures from 450 to 600° C. in a nitrogen atmosphere. When the RTA method is employed, a lamp light source for heating is turned on for 1 to 60 seconds, preferably for 30 to 60 seconds, which is repeated 1 to 10 times, preferably 2 to 6 times. The light-emission intensity of the lamp light source may be set arbitrarily; however it is set so that the semiconductor film is heated instantaneously at temperatures from 600 to 1000° C., preferably from approximately 700 to 750° C.

Through the heat treatment, the catalyst element inside the semiconductor film 521 is moved to the semiconductor film 523 for gettering due to the diffusion as indicated by the arrows, and the catalyst element is thus gettered.

Next, the semiconductor film 523 for gettering is selectively removed by etching. The etching process is performed by dry etching using $ClF_3$ not applying plasma or by wet etching using an alkali solution such as a solution including hydrazine or tetraethylammonium hydroxide (chemical formula $(CH_3)_4NOH$). On this occasion, the oxide film 522 can prevent the semiconductor film 521 from being etched.

Next, after removing the oxide film 522 by hydrofluoric acid, the semiconductor film 521 is patterned to form island-shaped semiconductor films 524 to 526 (FIG. 6D). Various semiconductor elements, typically a TFT, can be formed using these island-shaped semiconductor films 524 to 526. It is noted that the gettering method is not limited to the method shown in this embodiment. Another method may also be employed to decrease the catalyst element in the semiconductor film.

In this embodiment, the laser irradiation melts an upper part of the semiconductor film but does not melt a lower part of the semiconductor film on a side closer to the substrate. Therefore, the crystal formed by the crystallization using the catalyst element remains without being melted in the lower part of the semiconductor film on the side closer to the substrate becomes a crystal nucleus, and the crystallization is promoted uniformly from the lower part on the substrate side toward the upper part of the semiconductor film. Moreover, the crystal orientation is easily aligned. Therefore, the surface of the semiconductor film is prevented from becoming rough as compared with the case of Embodiment 2. Moreover, the variation of the characteristic of the semiconductor elements to be formed afterward, typically a TFT, can be more suppressed.

It is noted that this embodiment has explained the process to promote crystallization by performing the heat treatment after the catalyst element is added and to enhance the crystallinity further by the laser irradiation. However, the present invention is not limited to this, and the heat treatment may be omitted. Specifically, after adding the catalyst element, the laser light may be emitted instead of the heat treatment in order to enhance the crystallinity.

This embodiment can be freely combined with Embodiment Mode 1 or 2, or Embodiment 1 or 2.

Embodiment 4

Embodiment 4 also explains an example in which the crystallization method by the laser irradiation apparatus in FIG. 3 is combined with the crystallization method by the catalyst element. However, the example explained here is different from Embodiment 3.

Figure 7A:
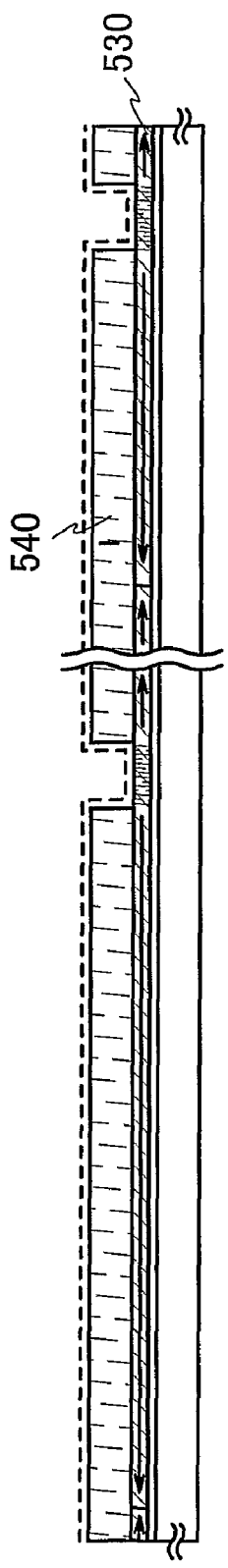
FIGS. 7A to 7D show a laser irradiation method and a manufacturing method of a semiconductor device.

The process up to forming the semiconductor film 502 is performed with reference to FIG. 5A in Embodiment 2. Next, a mask 540 having an opening is formed over the semiconductor film 502. Then, a nickel acetate solution including Ni in the range of 1 to 100 ppm in weight is applied to the surface of the semiconductor film 502 by a spin coating method. The catalyst element may be applied not only by the above method but also by a sputtering method, a vapor deposition method, a plasma process or the like. The applied nickel acetate solution contacts the semiconductor film 502 through the opening of the mask 540 (FIG. 7A).

Next, a heat treatment is performed for 4 to 24 hours at temperatures from 500 to 650° C., for example for 14 hours at a temperature of 570° C. This heat treatment forms a semiconductor film 530 in which the crystallization is promoted from the surface with the nickel acetate solution applied thereon as indicated by the solid-line arrows (FIG. 7A). The heat treatment may be performed not only by the above method but also by another method such as the method shown in Embodiment 3. In addition, as the catalyst element, elements recited in Embodiment 3 can be used.

Figure 7B:
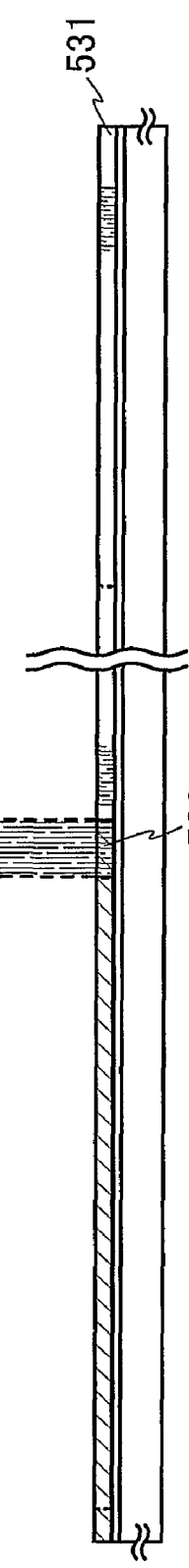

Subsequently, after removing the mask 540, the semiconductor film 530 is crystallized with the laser irradiation apparatus in FIG. 3 as shown in FIG. 7B. In this embodiment, a $YVO_4$ laser providing 2 W at 532 nm (second harmonic) with a repetition rate of 80 MHz and a pulse width of 12 ps is used. In this manner, a semiconductor film 531 with more enhanced crystallinity is formed by irradiating the semiconductor film 530 with laser light 538.

As shown in FIG. 7B, it is considered that the semiconductor film 531 crystallized using the catalyst element includes the catalyst element (herein Ni) at a concentration of approximately $1 \times 10^{19}$ atoms/cm$^3$. Then, the gettering of the catalyst element existing in the semiconductor film 531 is performed.

Figure 7C:
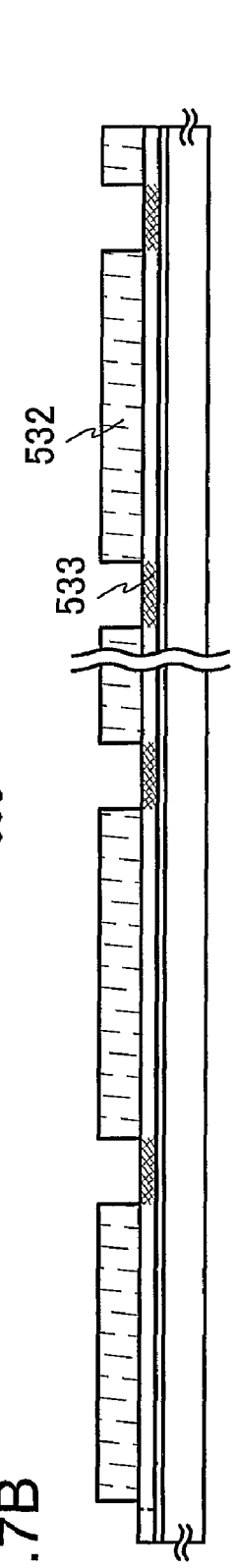

As shown in FIG. 7C, a silicon oxide film 532 to serve as a mask is formed to be 150 nm thick so as to cover the semiconductor film 531. Then, the silicon oxide film 532 is patterned to form an opening so that a part of the semiconductor film 531 is exposed. Then, phosphorus is added into the semiconductor film 531 to form a region 533 with the phosphorus added. When a heat treatment is performed in this state for 5 to 24 hours at temperatures from 550 to 800° C. in a nitrogen atmosphere, for example for 12 hours at a temperature of 600° C., the region 533 with the phosphorus added works as a gettering site, and the catalyst element left in the semiconductor film 531 moves to the gettering region 533 with the phosphorus added.

Figure 7D:
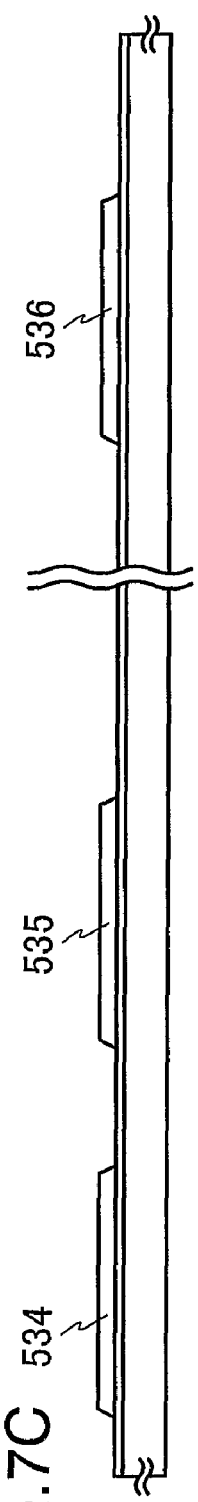

By etching the region 533 with the phosphorus added to be removed, the concentration of the catalyst element can be lowered to be $1 \times 10^{17}$ atoms/cm$^3$ or less in the rest of the semiconductor film 531. Next, after removing the silicon oxide film 532 serving as the mask, the semiconductor film 531 is patterned to form island-shaped semiconductor films 534 to 536 (FIG. 7D). These island-shaped semiconductor films 534 to 536 can be used to form various semiconductor elements typified by a TFT. The gettering method is not limited to that shown in this embodiment. Another method may also be employed to decrease the catalyst element in the semiconductor film.

In this embodiment, the laser irradiation melts an upper part of the semiconductor film but does not melt a lower part of the semiconductor film on a side closer to the substrate. Therefore, the crystal formed by the crystallization using the catalyst element remains without being melted in the lower part of the semiconductor film on the side closer to the substrate becomes a crystal nucleus, and the crystallization is promoted uniformly from the lower part on the substrate side toward the upper part of the semiconductor film. Moreover, the crystal orientation is easily aligned. Therefore, the surface of the semiconductor film is prevented from becoming rough as compared with the case of Embodiment 2. Moreover, the variation of the characteristic of the semiconductor elements to be formed afterward, typically a TFT, can be more suppressed.

It is noted that this embodiment has explained the process to promote crystallization by performing the heat treatment after the catalyst element is added and to enhance crystallinity further by the laser irradiation. However, the present invention is not limited to this, and the heat treatment may be omitted. Specifically, after adding the catalyst element, the laser light may be emitted instead of the heat treatment in order to enhance the crystallinity.

This embodiment can be freely combined with Embodiment Mode 1 or 2, or Embodiment 1, 2 or 3.

Embodiment 5

Figure 8:
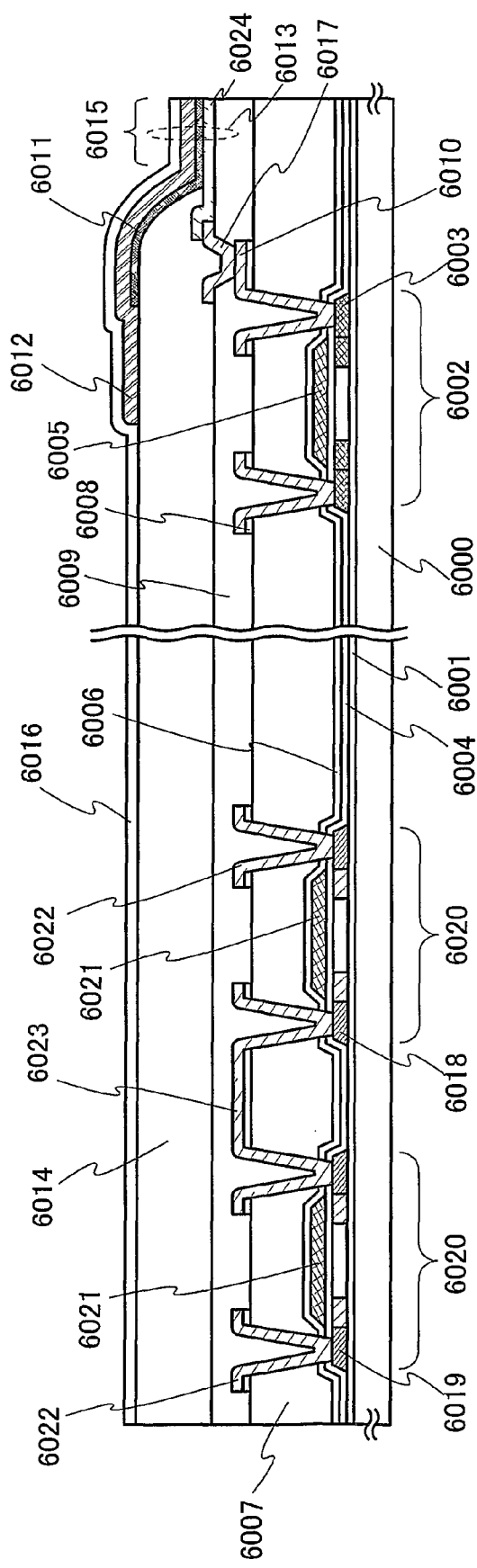
FIG. 8 shows structures of a driver circuit and a pixel in a light-emitting device which is one of semiconductor display devices formed using a laser irradiation apparatus.

Embodiment 5 explains, with reference to FIG. 8, a driver circuit and a pixel structure of a light-emitting device, which is one of semiconductor display devices that can be manufactured using the laser irradiation apparatus in FIG. 3.

In FIG. 8, a base film 6001 is formed over a substrate 6000, and thin film transistors 6002 and 6020 are formed over the base film 6001. The thin film transistor 6002 arranged in a pixel portion includes an island-shaped semiconductor film 6003, a gate electrode 6005, and a gate insulating film 6004 interposed between the island-shaped semiconductor film 6003 and the gate electrode 6005. The thin film transistor 6020 arranged in a driving circuit includes island-shaped semiconductor films 6018 and 6019, a gate electrode 6021 and a gate insulating film 6004 interposed between the island-shaped semiconductor films and the gate electrode 6021.

The island-shaped semiconductor films 6003, 6018 and 6019 are each a polycrystalline semiconductor film that is crystallized by scanning laser light in a direction of a channel width using the laser irradiation apparatus in FIG. 3. Here, only two TFTs are shown; however, at least two rows×two columns of TFTs are provided in the driver circuit and are electrically connected in parallel. A part of the driver circuit is formed by the method described in Embodiment Mode 1 or 2, thereby reducing variations in operation of the circuits. Note that the channel length perpendicular to the direction of the channel width corresponds to a length of a channel-forming region overlapping the gate electrode 6021.

As the gate insulating film 6004, silicon oxide, silicon nitride, or silicon oxynitride can be used. Moreover, the gate insulating film 6004 may be formed by stacking these materials. For example, a film in which SiN is formed on $SiO_2$ may be used as the gate insulating film. The gate electrode 6005 is formed of an element selected from Ta, W, Ti, Mo, Al, and Cu or formed of an alloy material or a compound material including such an element as its main component. Furthermore, a semiconductor film typified by a polycrystalline silicon film with an impurity element such as phosphorus doped may be used as the gate electrode 6005. Not only a single layer of a conductive film but also a stacked layer of plural conductive films may be used as the gate electrode 6005.

The transistors 6002 and 6020 are covered by a first interlayer insulating film 6006. A second interlayer insulating film 6007 and a fourth interlayer insulating film 6009 are formed over the first interlayer insulating film 6006 in order. The first interlayer insulating film 6006 may be a single layer or a stacked layer formed of silicon oxide, silicon nitride, or silicon oxynitride by a plasma CVD method or a sputtering method.

The second interlayer insulating film 6007 and the fourth interlayer insulating film 6009 can be formed of an organic resin film, an inorganic insulating film, an insulating film that includes a Si—$CH_X$ bond and a Si—O bond such as a siloxane based material, or the like. In this embodiment, non-photosensitive acrylic is used.

A third interlayer insulating film 6008 formed over a part of the second interlayer insulating film 6007 is etched using a first electrode 6010, a source electrode 6022 and a drain electrode 6023 as masks, after the first electrode 6010, the source electrode 6022 and the drain electrode 6023 are formed. The third interlayer insulating film 6008 employs a film that is difficult to allow a substance such as water or oxygen, which promotes deterioration of a light-emitting element, to permeate, as compared with other insulating films. Typically, a DLC film, a carbon nitride film, a silicon nitride film formed by RF sputtering, or the like is preferably used, for example.

In FIG. 8, reference numeral 6017 is a connection electrode; 6024, a second electrode; 6011, an electroluminescent layer; 6012, a third electrode; and a portion where the second electrode 6024, the electroluminescent layer 6011 and the third electrode 6012 are stacked corresponds to a light-emitting element 6013. The transistor 6002 is a driving transistor controlling a current to be supplied to the light-emitting element 6013, and is directly connected or serially connected via another circuit element to the light-emitting element 6013. The electroluminescent layer 6011 includes a single layer of a light-emitting layer or a stacked structure of plural layers including a light-emitting layer.

The second electrode 6024 is formed over the fourth interlayer insulating film 6009. An organic resin film 6014 is formed as a bank over the fourth interlayer insulating film 6009. Although this embodiment uses the organic resin film as the bank, an inorganic insulating film, an insulating film that includes a Si—$CH_X$ bond and a Si—O bond such as a siloxane based material, or the like can also be used as the bank. The organic resin film 6014 has an opening portion 6015, and the light-emitting element 6013 is formed by stacking the second electrode 6024, the electroluminescent layer 6011 and the third electrode 6012 in the opening portion 6015.

A protective film 6016 is formed over the organic resin film 6014 and the third electrode 6012. As well as the third interlayer insulating film 6008, the protective film 6016 is formed using a film that is difficult to allow a substance such as water or oxygen, which promotes deterioration of a light-emitting element, to permeate, as compared with other insulating films. For example, a DLC film, a carbon nitride film, a silicon nitride film formed by RF sputtering, or the like is used as the protective film 6016.

It is preferable to make an edge portion of the opening portion 6015 of the organic resin film 6014 round so as to prevent the electroluminescent layer 6011 partially overlapping the organic resin film 6014 from being perforated. Specifically, the sectional surface of the organic resin film in the opening portion desirably has a curvature radius ranging from approximately 0.2 to 2 µm. With the structure, the coverage of the electroluminescent layer and the third electrode to be formed afterward can be improved, and it is possible to prevent a short circuit between the second electrode 6024 and the third electrode 6012 in the hole formed in the electroluminescent layer 6011. Moreover, when the stress of the electroluminescent layer 6011 is relaxed, it is possible to decrease a defect called shrinkage in which the light-emitting region decreases and to enhance the reliability.

FIG. 8 shows an example of using a positive photosensitive acrylic resin as the organic resin film 6014. As for the photosensitive organic resin, there are a positive type in which a region exposed to energy such as light, electron, or ion is removed and a negative type in which a region exposed to the energy is not removed. The negative organic resin film may be used in the present invention. Moreover, a photosensitive polyimide may be used to form the organic resin film 6014. In the case of forming the organic resin film 6014 using a negative acrylic, the edge portion of the opening portion 6015 is shaped like a letter of S in its cross section. On this occasion, it is desirable that the curvature radius in the upper edge portion and the lower edge portion of the opening portion is in the range of 0.2 to 2 µm.

It is noted that one of the second electrode 6024 and the third electrode 6012 is an anode and the other is a cathode.

The anode can be formed using a light-transmitting conductive oxide material such as indium tin oxide (ITO), zinc oxide (ZnO), indium zinc oxide (IZO), or gallium-doped zinc oxide (GZO). Moreover, indium tin oxide (ITO) including silicon oxide (hereinafter referred to as ITSO), or indium oxide including silicon oxide into which zinc oxide (ZnO) of 2 to 20% is added may be used. Furthermore, the anode may be a single layer including one or a plurality of elements selected from TiN, ZrN, Ti, W, Ni, Pt, Cr, Ag, Al, and the like; two layers formed by stacking a titanium nitride film and a film mainly including aluminum; three layers formed by stacking a titanium nitride film, a film mainly including aluminum, and a titanium nitride film; or the like. When the anode is formed using a material different from the light-transmitting conductive oxide material and light is emitted from the anode side, the anode is formed to have enough thickness for the light to transmit (preferably from approximately 5 to 30 nm).

The cathode can be formed using a metal, an alloy, a conductive compound, or a mixture of these materials each having a low work function. Specifically, the cathode can be formed of an alkali metal such as Li or Cs; an alkaline earth metal such as Ca, Sr, or Mg; an alloy including these such as Mg:Ag, Al:Li, or Mg:In; a compound of these such as $CaF_2$ or CaN; or a rare-earth metal such as Yb or Er. When an electron-injecting layer is provided in the electroluminescent layer 6011, a conductive layer such as Al can be used. When light is emitted from the cathode side, the cathode can be formed of a light-transmitting conductive oxide material such as the indium tin oxide (ITO), zinc oxide (ZnO), indium zinc oxide (IZO), or gallium-doped zinc oxide (GZO). Moreover, the cathode may be formed using indium tin oxide including silicon oxide (hereinafter referred to as ITSO), or indium oxide including silicon oxide into which zinc oxide (ZnO) of 2 to 20% is further mixed. In the case of using such a light-transmitting conductive oxide material, an electron-injecting layer is preferably provided for the electroluminescent layer 6011 to be formed afterward. By forming the cathode to have enough thickness for the light to transmit (preferably, about 5 to 30 nm) without the use of the light-transmitting conductive oxide material, the light can be taken from the cathode side. In this case, the sheet resistance of the cathode may be suppressed by forming a light-transmitting conductive film using the light-transmitting conductive oxide material to contact the upper part or the lower part of the cathode.

Although FIG. 8 shows the structure in which light emitted from the light-emitting element passes through the substrate 6000, the light-emitting device may have a structure in which the light is emitted to the side opposite to the substrate.

After the light-emitting device shown in FIG. 8 is obtained, it is preferable to package (enclose) the light-emitting device using a protective film (laminate film, ultraviolet curable resin film, or the like) or a light-transmitting cover material that is highly airtight and hardly degasses not to be exposed to the air. The reliability of the light-emitting element is enhanced if the inside enclosed with the cover material is made an inert atmosphere or a hygroscopic material (such as barium oxide) is set in the inside.

Although this embodiment shows the light-emitting device as an example of the semiconductor display device, the semiconductor display device formed using the manufacturing method of the present invention is not limited to this.

This embodiment can be freely combined with Embodiment Mode 1 or 2, or Embodiment 1, 2, 3 or 4.

Embodiment 6

Although an example of the bottom emission light-emitting device is described in Embodiment 5, an example of manufacturing a top emission light-emitting device is described in Embodiment 6.

First, a base insulating film is formed over a first substrate 401. The first substrate 401 is not limited particularly as long as it is flat and heat-resistant. A base film formed of an insulating film such as a silicon oxide film, a silicon nitride film, or a silicon oxynitride film is formed as the base insulating film.

Then, a semiconductor layer is formed over the base insulating film. A semiconductor film having an amorphous structure is formed with a known method (a sputtering method, an LPCVD method, a plasma CVD method, or the like). Thereafter, a crystalline semiconductor film obtained by using the laser irradiation apparatus in FIG. 3 and performing a known crystallization process according to Embodiment Mode 1 or 2 is patterned to have a desired shape with a first photomask.

In this embodiment, the second harmonic to the fourth harmonic of a fundamental wave of a solid-state CW laser is applied. Typically, the second harmonic (532 nm) or the third harmonic (355 nm) of an Nd:$YVO_4$ laser (fundamental wave is 1064 nm) may be applied.

The semiconductor layer is formed to be 25 to 80 nm thick (preferably 30 to 70 nm thick). The material of the crystalline semiconductor film is not limited; however, silicon, a silicon germanium (SiGe) alloy or the like may be used.

After removing the resist mask, a gate insulating film covering the semiconductor layer is formed. The gate insulating film is formed to have a thickness of 1 to 200 nm by a plasma CVD method, a sputtering method, or a thermal oxidation method.

Then, a conductive film with a thickness of 100 to 600 nm is formed over the gate insulating film. Here, a conductive film having a stacked layer of a TaN film and a W film is formed by a sputtering method. Although the conductive film here is the stacked layer of a TaN film and a W film, the conductive film is not limited particularly. The conductive film may be formed using an element selected from Ta, W, Ti, Mo, Al, and Cu; a single layer of an alloy material or a compound material containing the element as the main component; or a stacked layer thereof. Alternatively, a semiconductor film typified by a polycrystalline silicon film into which an impurity element such as phosphorus is doped may also be used.

Then, a resist mask is formed using a second photomask and etching is conducted by a dry etching method or a wet etching method. A gate electrode of a TFT 404 is formed by etching the conductive film in the etching process.

After removing the resist mask, a new resist mask is formed using a third photomask, and in order to form an n-channel TFT which is not shown in the drawing, a first doping step for doping an impurity element imparting n-type conductivity (typically, phosphorus or arsenic) to a semiconductor to form a low-concentration region is performed. The resist mask covers a region to become a p-channel TFT and the vicinity of the conductive layer. According to the first doping step, through doping is performed through the insulating film to form an n-type low-concentration impurity region. Although one light-emitting element is driven using a plurality of TFTs, the doping step is not particularly required when the light-emitting element is driven using only p-channel TFTs.

After removing the resist mask, a new resist mask is formed using a fourth photomask, and a second doping step for doping an impurity element imparting p-type conductivity (typically, boron) to a semiconductor to form a high-concentration region is performed. According to the second doping step, through doping is performed through the gate insulating film to form a p-type high-concentration impurity region.

Then, a new resist mask is formed using a fifth photomask, and in order to form an n-channel TFT which is not shown in the drawing, a third doping step for doping an impurity element imparting n-type conductivity (typically, P (phosphorus) or As (arsenic)) to a semiconductor to form a high-concentration region is performed. The resist mask covers a region to become a p-channel TFT and the vicinity of the conductive layer. According to the third doping step, through doping is performed through the insulating film to form an n-type high-concentration impurity region.

Thereafter, after removing the resist mask and forming an insulating film containing hydrogen, the impurity element added into the semiconductor layer is activated and hydrogenated. A silicon nitride oxide film (SiNO film) obtained by a PCVD method is used as the insulating film containing hydrogen.

Then, a planarizing film 410 to become a second interlayer insulating film is formed. The planarizing film 410 is formed using an inorganic material (silicon oxide, silicon nitride, silicon oxynitride, or the like); a photosensitive or non-photosensitive organic material (polyimide, acrylic, polyamide, polyimide amide, resist, or benzocyclobutene); a stacked layer thereof; or the like. In addition, an insulating film formed of a $SiO_x$ film containing an alkyl group that is obtained by a coating method, for example, an insulating film formed using silica glass, an alkyl siloxane polymer, an alkyl silsesquioxane polymer, a hydrogenated silsesquioxane polymer, a hydrogenated alkyl silsesquioxane polymer, or the like can be used as another film used as the planarizing film. There are coating materials for an insulating film such as #PSB-K1 and PSB-K31 manufactured by Toray Industries, Inc. and ZRS-5PH manufactured by Catalysts & Chemicals Industries Co., Ltd. as an example of a siloxane-based polymer.

Next, a contact hole is formed in the interlayer insulating film by using a sixth mask. After removing the sixth mask and forming a conductive film (a stacked layer of a TiN film, an Al (C+Ni) alloy film and a TiN film), etching is performed using a seventh mask to form a wiring (source and drain wirings of a TFT, a current supply wiring or the like).

Then the seventh mask is removed and a third interlayer insulating film 411 is formed. The third interlayer insulating film 411 is formed using a photosensitive or non-photosensitive organic material in which a black colorant is dispersed, which is obtained by a coating method. In this embodiment, a light-shielding interlayer insulating film is used to improve contrast and to absorb stray light. In order to protect the third interlayer insulating film 411, a silicon nitride oxide film (SiNO film) obtained by a PCVD method may be stacked thereover as a fourth interlayer insulating film. When the fourth interlayer insulating film is formed, it is preferable that the fourth interlayer insulating film is selectively removed by using a first electrode as a mask after patterning the first electrode in the following step.

Then, a contact hole is formed in the third interlayer insulating film 411 using an eighth mask.

After forming a reflective conductive film and a transparent conductive film, patterning is performed using a ninth mask to obtain a stacked layer of a reflective electrode 412 and a transparent electrode 413. The reflective electrode 412 is formed using Ag, Al, or an Al (C+Ni) alloy film. For example, the transparent electrode 413 can be formed using a transparent conductive material such as indium tin oxide containing a Si element (ITSO) or IZO (Indium Zinc Oxide) into which 2% to 20% of zinc oxide (ZnO) is mixed in indium oxide, besides indium tin oxide (ITO).

Next, an insulator 419 to become a bank by covering edge portions of the reflective electrode 412 and the transparent electrode 413 is formed using a tenth mask. The insulator 419 is formed using a photosensitive or non-photosensitive organic material (polyimide, acrylic, polyamide, polyimide amide, resist, or benzocyclobutene) or an SOG film (for example, a $SiO_x$ film including an alkyl group) to have a film thickness from 0.8 to 1 μm.

Thereafter, a layer containing an organic compound 414 is formed using a vapor deposition method or a coating method. In order to obtain full-color display, the layer containing an organic compound 414 is selectively formed to form three kinds of pixels of R, G, and B.

Then, a transparent electrode 415, in other words, a cathode of the organic light-emitting element is formed over the layer containing an organic compound 414 to be 10 to 800 nm thick. Besides indium tin oxide (ITO), for example, the transparent electrode 415 can be formed using indium tin oxide containing a Si element (ITSO) or IZO (Indium Zinc Oxide) in which 2% to 20% of zinc oxide (ZnO) is mixed in indium oxide.

The light-emitting elements are formed in this manner.

Next, transparent protective layers 405 and 416 for preventing the penetration of water are formed to cover the light-emitting element. The transparent protective layers 405 and 416 can be formed using a silicon nitride film, a silicon oxide film, a silicon oxynitride film (a SiNO film (composition ratio N>O) or a SiON film (composition ratio N<O)), a thin film containing carbon as the main component (for example, a DLC film or a CN film) or the like, which can be obtained by a sputtering method or a CVD method.

Then, a second substrate 403 and the first substrate 401 are attached to each other using a sealing material containing a gap material (a filler (a fiber rod), fine particles (such as a silica spacer) or the like) for maintaining a gap between the substrates. A filler 417, typically, an ultraviolet curable-epoxy resin or a thermosetting-epoxy resin is filled between a pair of the substrates. In addition, a glass substrate, a quartz substrate, or a plastic substrate each having a light-transmitting property may be used for the second substrate 403. As compared with the case where a space (inert gas) exists between the pair of the substrates, the entire transmissivity can be improved by filling a transparent filler (reflective index of approximately 1.50) between the pair of the substrates.

Figure 9A:
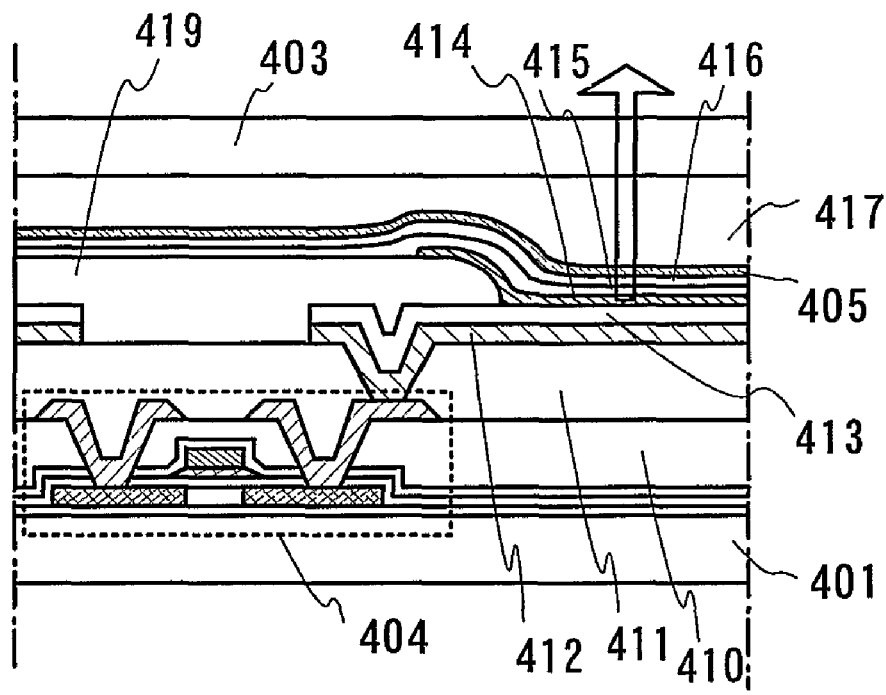
FIGS. 9A and 9B are each a cross-sectional view of a light-emitting element.

As shown in FIG. 9A, the transparent electrode 415, the transparent protective layers 416 and 405, and the filler 417 in the light-emitting element according to this embodiment are each formed from a light-transmitting material, so that light can be emitted upwardly as denoted by the outline arrow.

Hereinafter, an example of manufacturing a dual emission light-emitting device is described with reference to FIG. 9B.

A base insulating film is formed first over a first light-transmitting substrate 501. The first substrate 501 is not limited particularly as long as it is a light-transmitting substrate.

Then, a semiconductor layer is formed over the base insulating film. Then, a gate insulating film for covering the semiconductor layer is formed and a gate electrode is formed over the gate insulating film.

Then, an n-type low-concentration impurity region, a p-type high-concentration impurity region, an n-type high-concentration impurity region, or the like are formed appropriately by doping. After removing a resist mask and forming an insulating film (a light-transmitting interlayer insulating film) containing hydrogen, an impurity element added into the semiconductor layer is activated and hydrogenated.

A light-transmitting planarizing film 510 to become a second interlayer insulating film is formed thereafter. The light-transmitting planarizing film 510 is formed using an inorganic material (silicon oxide, silicon nitride, silicon oxynitride, or the like); a photosensitive or non-photosensitive organic material (polyimide, acrylic, polyamide, polyimide amide, resist, or benzocyclobutene); a stacked layer thereof; or the like.

After forming a contact hole in the interlayer insulating film, a conductive film (a stacked layer of a TiN film, an Al (C+Ni) alloy film and a TiN film) is formed, and then, etching is selectively performed to form a wiring (source and drain wirings of a TFT, a current supply wiring or the like).

Then, a third interlayer insulating film 511 is formed. The third interlayer insulating film 511 is formed using an insulating film formed of a $SiO_x$ film containing an alkyl group, which is obtained by a coating method. In order to protect the third interlayer insulating film 511, a silicon nitride oxide film (SiNO film) obtained by a PCVD method may be stacked as a fourth interlayer insulating film. When the fourth interlayer insulating film is formed, it is preferable that the fourth interlayer insulating film is selectively removed by using a first electrode as a mask after patterning the first electrode in the following step.

A contact hole is formed in the third interlayer insulating film 511.

After forming a transparent conductive film, a transparent electrode 513 is obtained by patterning. For example, the transparent electrode 513 is formed using a transparent conductive material having a high work function (4.0 eV or higher) such as indium tin oxide containing a Si element (ITSO) or IZO (Indium Zinc Oxide) in which 2% to 20% of zinc oxide (ZnO) is mixed in indium oxide, besides indium tin oxide (ITO).

Then, an insulator 519 for covering an edge portion of the transparent electrode 513 is formed by using a mask.

A layer containing an organic compound 514 is formed using a vapor deposition method or a coating method thereafter.

Then, a transparent electrode 515, in other words, a cathode of organic light-emitting element is formed over the layer containing an organic compound 514 to be 10 to 800 nm thick. Besides indium tin oxide (ITO), for example, the transparent electrode 515 can be formed using indium tin oxide containing a Si element (ITSO) or IZO (Indium Zinc Oxide) in which 2% to 20% of zinc oxide (ZnO) is mixed in indium oxide.

Next, transparent protective layers 505 and 516 for preventing the penetration of water are formed to cover the light-emitting element. Thereafter, a second substrate 503 and the first substrate 501 are attached to each other using a sealing material containing a gap material for maintaining a gap between the substrates. In addition, a glass substrate, a quartz substrate, or a plastic substrate each having a light-transmitting property may be used for the second substrate 503.

Figure 9B:
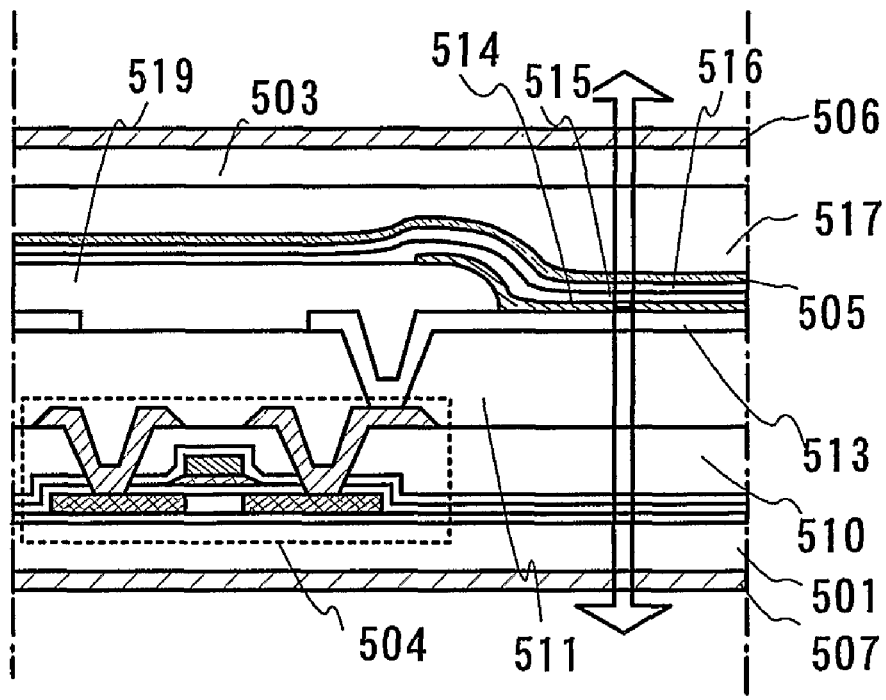

As shown in FIG. 9B, the transparent electrode 515 and a filler 517 in the thusly obtained light-emitting element are each formed from a light-transmitting material, so that light can be emitted upwardly and downwardly as denoted by the outline arrows.

Then, optical films (a polarizing plate or a circularly polarizing plate) 506 and 507 are provided to improve a contrast.

For example, the substrate 501 is provided with an optical film 507 (a quarter wave plate and a polarizing plate are disposed in this order from the substrate side) and the second substrate 503 is provided with an optical film 506 (a quarter wave plate and a polarizing plate are disposed in this order from the substrate side).

In addition, as another example, the substrate 501 is provided with an optical film 507 (a quarter wave plate, a half wave plate and a polarizing plate are disposed in this order from the substrate side) and the second substrate 503 is provided with an optical film 506 (a quarter wave plate, a half wave plate and a polarizing plate are disposed in this order from the substrate side).

Thus, according to the present invention, a polarizing plate, a circularly polarizing plate, or a combination thereof can be provided depending on a structure of a dual emission light-emitting device. Therefore, a clear black display can be performed and a contrast is improved. Further, the circularly polarizing plate can prevent reflective light.

This embodiment can be freely combined with Embodiment Mode 1 or 2, or Embodiment 1, 2, 3, 4 or 5.

Embodiment 7

An example of mounting an FPC or a driver IC on an EL display panel manufactured according to the above described embodiments is described in Embodiment 7.

Figure 10:
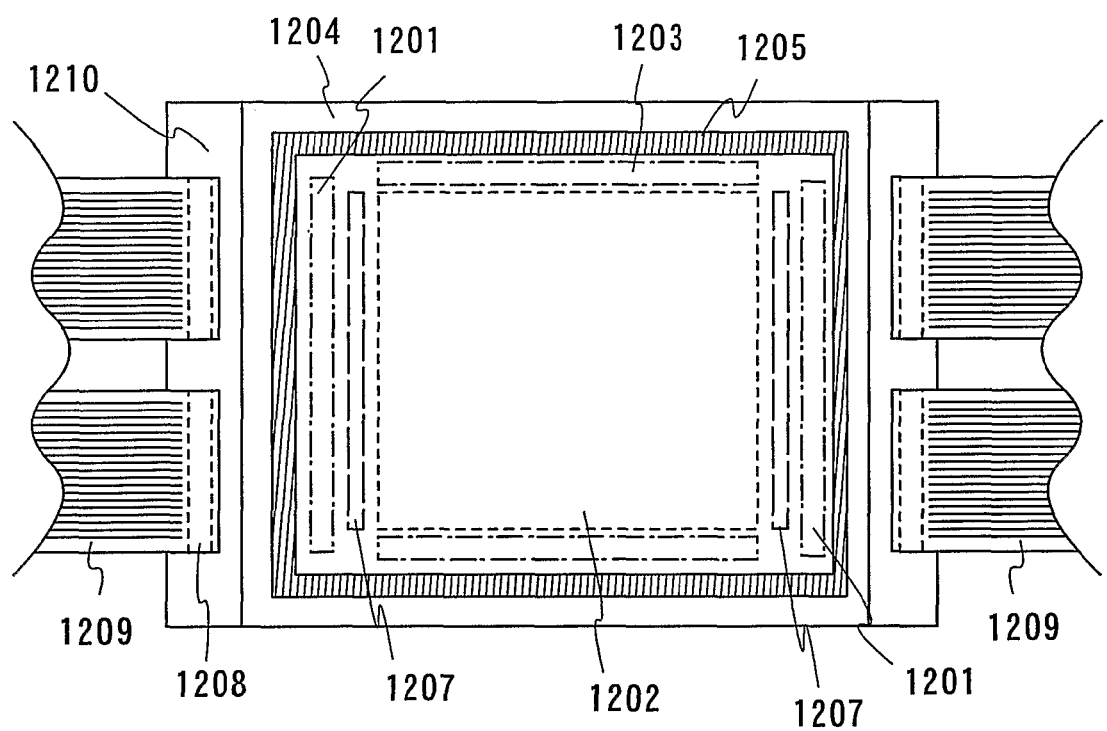
FIG. 10 is a top view of a light-emitting module.

FIG. 10 is a top view of a light-emitting device in which FPCs 1209 are attached to four terminal portions 1208 as an example. A pixel portion 1202 including a light-emitting element and a TFT, a gate-side driver circuit 1203 including a TFT, and a source-side driver circuit 1201 including a TFT are formed over a substrate 1210. These circuits can be formed over one substrate when active layers of TFTs each are formed from a semiconductor film having a crystalline structure. Therefore, an EL display panel in which the system-on-panel is realized can be manufactured.

Note that the portion of the substrate 1210 except a contact portion is covered with a protective film and a base layer containing a material having a photocatalytic function is provided over the protective film.

Two connecting regions 1207 provided so as to sandwich the pixel portion are provided for contacting a second electrode of a light-emitting element to a lower wiring. Note that a first electrode of the light-emitting element is electrically connected to a TFT provided in the pixel portion.

A sealing substrate 1204 is fixed to the substrate 1210 by a sealing material 1205 surrounding the pixel portion and the driver circuits and by a filler surrounded with the sealing material. In addition, a structure in which a filler including a transparent drying agent is filled may also be employed. The drying agent may be disposed in a region which is not overlapped with the pixel portion.

The structure shown in FIG. 10 is suitable for a light-emitting device of a relatively large size of XGA class (for example, the opposite angle: 4.3 inches); however the present invention is not limited particularly. A driver IC may be mounted by a COG mode as a part of the driving circuit.

The driver IC is superior to an IC chip in terms of an external size, since it has a longer side. When a driver IC formed to be 15 to 80 mm in a longer side is used, the number of driver ICs to be required for being mounted corresponding to the pixel portion is small, as compared with the case of using IC chips, thereby improving the yield in manufacturing. When a driver IC is formed over a glass substrate, the productivity is not lost because there is no limitation on the shape of a mother substrate. This is a great advantage, as compared with the case of taking out an IC chip from a circular silicon wafer.

In addition, a TAB mode may be employed, and in that case, a plurality of tapes are attached and a driver IC may be mounted on the tapes. As in the case of the COG mode, a single driver IC may be mounted on a single tape. In this case, a metal piece or the like for fixing a driver IC is preferably attached together for enhancing the intensity.

This embodiment can be freely combined with Embodiment Mode 1 or 2, Embodiment 1, 2, 3, 4, 5 or 6.

Embodiment 8

The following can be given as an example of display devices and electronic devices according to the present invention: a camera such as a video camera or a digital camera, a goggle type display (head mounted display), a navigation system, an audio reproducing device (such as a car audio or an audio component), a laptop computer, a game machine, a portable information terminal (such as a mobile computer, a cellular phone, a portable game machine or an electronic book), an image reproduction device provided with a recording medium (specifically a device that is capable of playing a recording medium such as a Digital Versatile Disc (DVD) and that has a display device that can display the image), a video-audio bi-directional communication device, an all-purpose remote-control device and the like. FIGS. 11A and 11B and FIGS. 12A to 12E each show a specific example of the electronic devices.

Figure 11A:
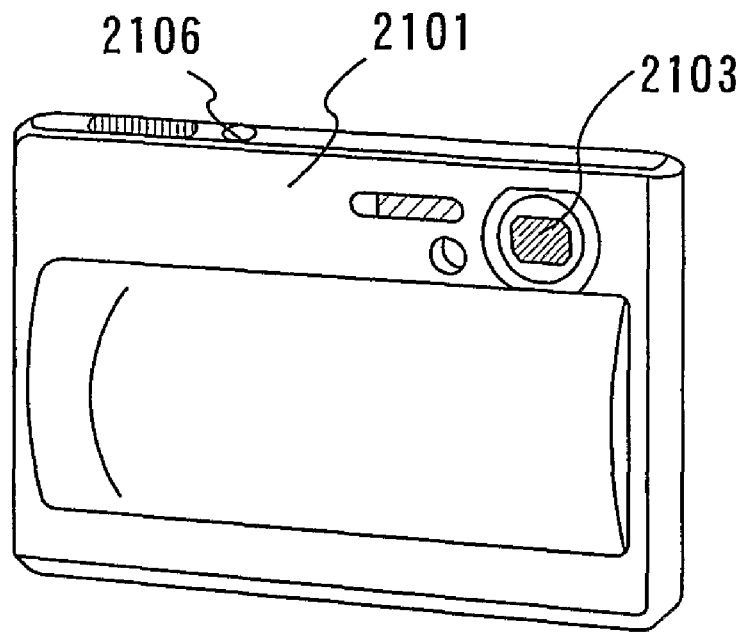
FIGS. 11A and 11B each show one example of electronic devices.
Figure 11B:
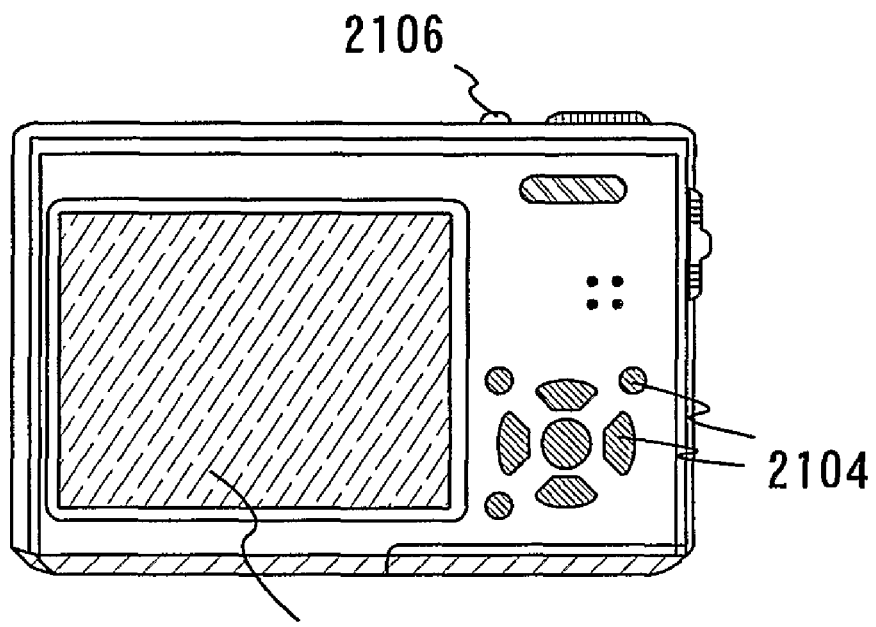

FIGS. 11A and 11B show a digital camera, which includes a main body 2101, a display portion 2102, an imaging portion 2103, operation keys 2104, a shutter 2106, and the like. According to the present invention, a digital camera having the display portion 2102 without display unevenness (mura) can be realized.

Figure 12A:
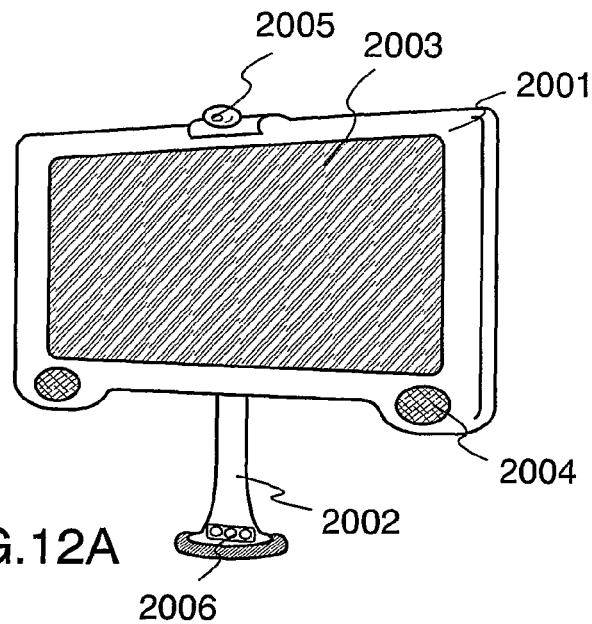
FIGS. 12A to 12E each show one example of electronic devices.

FIG. 12A shows a large-sized display device having a large screen of 22 to 50 inches, which includes a casing 2001, a support 2002, a display portion 2003, a speaker portion 2004, an imaging portion 2005, a video input terminal 2006 and the like. Note that the display device includes all types of display devices for an information display, for example, for a personal computer, for TV broadcast reception, and the like. According to the present invention, a large-sized display device, in which display unevenness (mura) is suppressed or variations in operation of driver circuits are reduced, can be completed, even in the case of having a large screen of 22 to 50 inches.

Figures 12B, 12C:
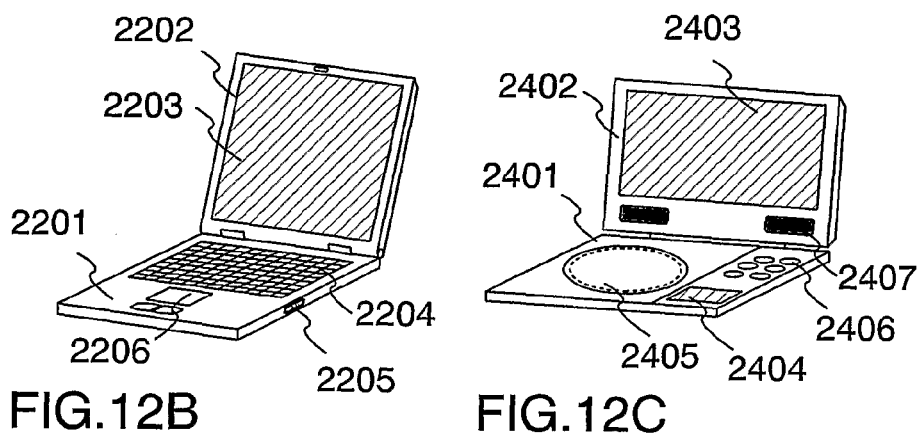

FIG. 12B shows a laptop computer, which includes a main body 2201, a casing 2202, a display portion 2203, a keyboard 2204, an external-connection port 2205, a pointing mouse 2206 and the like. According to the present invention, a laptop computer, in which display unevenness (mura) is suppressed or variations in operation of driver circuits are reduced, can be completed.

FIG. 12C shows a portable image reproduction device with a recording medium (specifically, a DVD player), which includes a main body 2401, a casing 2402, a display portion A 2403, a display portion B 2404, a recording medium (such as DVD) loading portion 2405, operation keys 2406, a speaker portion 2407 and the like. The display portion A 2403 mainly displays image information, and the display portion B 2404 mainly displays character information. Note that the image reproduction device provided with a recording medium includes a home-use game machine and the like. According to the present invention, an image reproduction device, in which display unevenness (mura) is suppressed or variations in operation of driver circuits are reduced, can be completed.

Figure 12D:
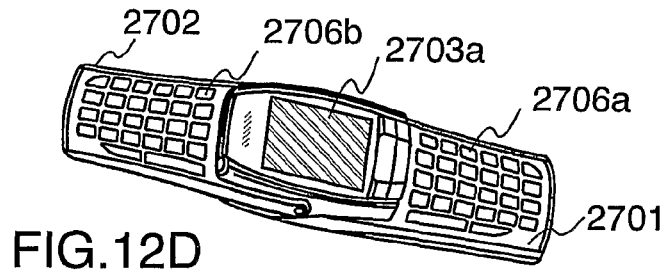
Figure 12E:
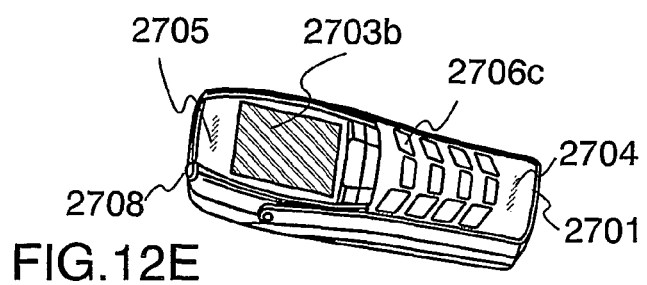

FIG. 12D is a perspective view of a portable information terminal, and FIG. 12E is a perspective view showing a state of using it with the cellular phone folded. In FIG. 12D, a user operates the cellular phone by hitting operation keys 2706a with his/her right fingers and operation keys 2706b with his/her left fingers, like a keyboard. According to the present invention, a portable information terminal, in which display unevenness (mura) is suppressed or variations in operation of driver circuits are reduced, can be completed.

As shown in FIG. 12E, in folding the cellular phone, a user holds a main body 2701 and a casing 2702 in one hand and uses an audio input portion 2704, an audio output portion 2705, operation keys 2706c, an antenna 2708, and the like.

The portable information terminal shown in FIGS. 12D and 12E each includes a high-definition display portion 2703a which horizontally displays images and characters mainly and a high-definition display portion 2703b which vertically displays them.

As described above, various electronic devices can be completed by employing a manufacturing method or a structure in any one of Embodiment Modes 1 and 2, and Embodiments 1 to 7.

EXPLANATION OF REFERENCE

11: laser beam, 12: scanning direction, 13: non-irradiated region (amorphous), 14a: irradiated region (crystal), 14b: irradiated region (microcrystal), 15a: region to become a channel, 15b: region to become an active layer, 16a: first semiconductor layer, 16b: second semiconductor layer, 17: gate wiring, 18: source wiring, 19: drain wiring, 20: substrate, 21a: silicon nitride oxide film, 21b: silicon oxynitride film, 22: source region, 23: drain region, 24a: first insulating film, 24b: second insulating film, 25: interlayer insulating film, 31: laser beam, 32: scanning direction, 33: non-irradiated region (amorphous), 34a: irradiated region (microcrystal), 34b: irradiated region (crystal), 35a: region to become a channel, 35b: region to become an active layer, 36a: first semiconductor layer, 36b: second semiconductor layer, 36c: third semiconductor layer, 37: gate wiring, 38: source wiring, 39: drain wiring, 101: laser oscillator, 102: non-linear optical element, 103: reflecting minor, 104: lens, 105: substrate, 106: semiconductor film, 107: stage, 108: uniaxial robot for X-axis, 109: uniaxial robot for Y-axis, 110: beam spot, 401: first substrate, 403: second substrate, 404: TFT, 405: transparent protective layer, 410: planarizing film, 411: interlayer insulating film, 412: reflective electrode, 413: transparent electrode, 414: layer containing an organic compound, 415: transparent electrode, 416: transparent protective layer, 417: filler, 419: insulator, 500: substrate, 501: base film, 502: semiconductor film, 503: semiconductor film, 505: transparent protective layer, 506: optical film, 507: island-shaped semiconductor film, 508: island-shaped semiconductor film, 509: island-shaped semiconductor film, 510: planarizing film, 511: interlayer insulating film, 513: transparent electrode, 514: layer containing an organic compound, 515: transparent electrode, 516: transparent protective layer, 517: filler, 519: insulator, 520: semiconductor film, 521: semiconductor film, 522: oxide film, 523: semiconductor film, 524: island-shaped semiconductor film, 525: island-shaped semiconductor film, 526: island-shaped semiconductor film, 530: semiconductor film, 531: semiconductor film, 532: silicon oxide film, 533: region doped with phosphorus, 534: island-shaped semiconductor film, 535: island-shaped semiconductor film, 536: island-shaped semiconductor film, 538: laser light, 540: mask, 1201: source side driver circuit, 1202: pixel portion, 1203: gate side driver circuit, 1204: sealing substrate, 1205: sealing material, 1207: connecting region, 1208: terminal portion, 1209: FPC, 1210: substrate, 2001: casing, 2002: support, 2003: display portion, 2004: speaker portion, 2005: imaging portion, 2006: video input terminal, 2101: main body, 2102: display portion, 2103: imaging portion, 2104: operation key, 2106: shutter, 2201: main body, 2202: casing, 2203: display portion, 2204: keyboard, 2205: external connection port, 2206: pointing mouse, 2401: main body, 2402: casing, 2403: display portion A, 2404: display portion B, 2405: recording medium loading portion, 2406: operation key, 2407: loudspeaker portion, 2701: main body, 2702: casing, 2703*a*: display portion, 2703*b*: display portion, 2704: audio input portion, 2705: audio output portion, 2706*a*: operation key, 2706*b*: operation key, 2706*c*: operation key, 2708: antenna, 6000: substrate, 6001: base film, 6002: thin film transistor, 6003: island-shaped semiconductor film, 6004: gate insulating film, 6005: gate electrode, 6006: first interlayer insulating film, 6007: second interlayer insulating film, 6008: third interlayer insulating film, 6009: fourth interlayer insulating film, 6010: first electrode, 6011: electroluminescent layer, 6012: third electrode, 6013: light-emitting element, 6014: organic resin film, 6015: opening portion, 6016: protective film 6017: connection electrode, 6018: island-shaped semiconductor film, 6019: island-shaped semiconductor film, 6020: thin film transistor, 6021: gate electrode, 6022: source electrode, 6023: drain electrode, 6024: second electrode

The invention claimed is:

1. A method of manufacturing a semiconductor device comprising:
   forming a semiconductor film on an insulating surface;
   scanning said semiconductor film with a laser beam to crystallize said semiconductor film;
   forming at least first and second semiconductor islands by patterning the crystallized semiconductor film; and
   forming a first thin film transistor using the first semiconductor island as an active layer including a first channel forming region thereof and a second thin film transistor using the second semiconductor island as an active layer including a second channel forming region thereof,
   forming a source wiring to connect the first and the second semiconductor islands which have the same crystalline state,
   wherein a sum of WC and WS, in which the WC is a sum of widths of the first and second channel forming regions and the WS is an interval between the first and second channel forming regions, is smaller than a width LP of the laser beam, and
   wherein the semiconductor film is not subjected to be patterned before the scanning step.

2. The method according to claim 1, further comprising a step of crystallizing the semiconductor film by heating before scanning the semiconductor film with the laser beam.

3. The method according to claim 1, wherein each width direction of the first and second channel forming regions is perpendicular to a scanning direction of the laser beam.

4. The method according to claim 1, wherein the first and second thin film transistors are electrically connected in parallel.

5. The method according to claim 1, wherein said semiconductor film comprises amorphous silicon.

6. A method of manufacturing a semiconductor device comprising:
   forming a semiconductor film on an insulating surface;
   scanning said semiconductor film with a laser beam to crystallize said semiconductor film;
   forming at least first and second semiconductor islands by patterning the crystallized semiconductor film; and
   forming a first thin film transistor using the first semiconductor island as an active layer including a first channel forming region thereof and a second thin film transistor using the second semiconductor island as an active layer including a second channel forming region thereof,
   forming a source wiring to connect the first and the second semiconductor islands which have the same crystalline state,
   wherein a sum of WC and WS, in which the WC is a sum of widths of the first and second channel forming regions and the WS is an interval between the first and second channel forming regions, is smaller than a width LP of the laser beam,
   wherein the semiconductor film is not subjected to be patterned before the scanning step, and
   wherein said laser beam is a continuous wave (CW) laser beam.

7. The method according to claim 6, further comprising a step of crystallizing the semiconductor film by heating before scanning the semiconductor film with the laser beam.

8. The method according to claim 6, wherein each width direction of the first and second channel forming regions is perpendicular to a scanning direction of the laser beam.

9. The method according to claim 6, wherein the first and second thin film transistors are electrically connected in parallel.

10. The method according to claim 6, wherein said semiconductor film comprises amorphous silicon.

11. A method of manufacturing a semiconductor device comprising:
    forming a semiconductor film on an insulating surface;
    scanning said semiconductor film with a laser beam to crystallize said semiconductor film;
    forming at least first and second semiconductor islands by patterning the crystallized semiconductor film; and
    forming a first thin film transistor using the first semiconductor island as an active layer including a first channel forming region thereof and a second thin film transistor using the second semiconductor island as an active layer including a second channel forming region thereof,
    forming a source wiring to connect the first and the second semiconductor islands which have the same crystalline state,
    wherein a sum of WC and WS, in which the WC is a sum of widths of the first and second channel forming regions and the WS is an interval between the first and second channel forming regions, is smaller than a width LP of the laser beam,
    wherein the semiconductor film is not subjected to be patterned before the scanning step, and
    wherein said laser beam is a pulsed laser beam having a repetition rate of 10 MHz or higher and 100 GHz or lower.

12. The method according to claim 11, further comprising a step of crystallizing the semiconductor film by heating before scanning the semiconductor film with the laser beam.

13. The method according to claim 11, wherein each width direction of the first and second channel forming regions is perpendicular to a scanning direction of the laser beam.

14. The method according to claim 11, wherein the first and second thin film transistors are electrically connected in parallel.

15. The method according to claim 11, wherein said semiconductor film comprises amorphous silicon.

* * * * *